(12) United States Patent
Tuff et al.

(10) Patent No.: US 7,174,260 B2
(45) Date of Patent: Feb. 6, 2007

(54) SYSTEM AND METHOD FOR READING POWER METERS

(75) Inventors: Maurice Tuff, Witless Bay (CA); Stephan Gagnon, Laval (CA)

(73) Assignee: Blue Line Innovations Inc., St. John's (CA)

( * ) Notice: Subject to any disclaimer, the term of this patent is extended or adjusted under 35 U.S.C. 154(b) by 137 days.

(21) Appl. No.: 10/814,255

(22) Filed: Apr. 1, 2004

(65) Prior Publication Data

US 2005/0222784 A1 Oct. 6, 2005

(51) Int. Cl.
*G01R 21/00* (2006.01)

(52) U.S. Cl. .......................................... 702/61; 702/62

(58) Field of Classification Search ................. 73/431, 73/462, 463; 324/74, 76.11, 103 R, 110, 324/137; 340/870.01, 870.02; 361/659; 700/22, 27, 286, 291; 702/1, 60, 61, 62, 702/187, 189
See application file for complete search history.

(56) References Cited

U.S. PATENT DOCUMENTS

| 4,059,747 A | 11/1977 | Brody |
| 4,119,948 A | 10/1978 | Ward et al. |
| 4,204,115 A | 5/1980 | Boldridge, Jr. |
| 4,697,182 A | 9/1987 | Swanson |
| 4,803,632 A | 2/1989 | Frew et al. |
| 4,811,011 A | 3/1989 | Sollinger |
| 4,819,180 A | 4/1989 | Hedman et al. |
| 4,956,551 A | 9/1990 | Repschlager et al. |
| 5,056,107 A | 10/1991 | Johnson et al. |
| 5,214,587 A * | 5/1993 | Green .......................... 702/60 |

(Continued)

FOREIGN PATENT DOCUMENTS

CA     2443987     10/2002

OTHER PUBLICATIONS

Pages from website—www.centameter.com/au/home.htm, printed Feb. 27, 2004.

(Continued)

*Primary Examiner*—John Barlow
*Assistant Examiner*—Douglas N. Washburn
(74) *Attorney, Agent, or Firm*—Bereskin & Parr

(57) ABSTRACT

A power meter reader system for automatically reading an indication on a power meter unit having a cyclical property that varies at a rate indicative of power consumption. The system comprises a detection unit that includes a sensor unit for monitoring the cyclical property of the indication and generating a consumption detection signal, a processing unit for generating an information signal based on data related to the consumption detection signal, and a transmitter for transmitting a transmission signal based on the information signal. The processing unit also generates a sensor enable signal to enable the sensor unit for only a portion of the cyclical property of the indication. The system further includes a display unit located remotely with respect to the detection unit for receiving the transmission signal and displaying the power consumption. The detection unit may also employ a prediction model for reducing power consumption in the detection unit.

92 Claims, 7 Drawing Sheets

U.S. PATENT DOCUMENTS

| | | |
|---|---|---|
| 5,371,511 A | 12/1994 | Atherton, Jr. et al. |
| 5,635,895 A * | 6/1997 | Murr .................... 340/310.01 |
| 5,880,464 A | 3/1999 | Vrionis |
| 5,880,677 A | 3/1999 | Lestician |
| 6,049,791 A | 4/2000 | Lerner |
| 6,369,719 B1 | 4/2002 | Tracy et al. |
| 6,476,592 B1 | 11/2002 | Humlum |
| 6,956,500 B1 | 10/2005 | Ducharme et al. |
| 2002/0105435 A1 | 8/2002 | Yee et al. |
| 2003/0193405 A1* | 10/2003 | Hunt et al. ............ 340/870.02 |
| 2004/0246143 A1* | 12/2004 | Crichlow ............... 340/870.02 |

OTHER PUBLICATIONS

Pages from website—www.energymonitor.com—Energy Monitoring Technologies Inc., Miami, FL, printed Nov. 24, 2003.

Pages from website—www.nwextension.com—Northwest Extension Inc. Kirkland, Wa, printed May 15, 2003.

Copy of International Search Report from PCT/CA2005/000473 dated Aug. 30, 2005.

* cited by examiner

SYSTEM AND METHOD FOR READING POWER METERS

FIELD OF THE INVENTION

The invention relates to a system and method for reading power meters. More particularly, the invention relates to a system and method for more efficiently reading power meters and providing an indication of power usage to a user of the power meter.

BACKGROUND OF THE INVENTION

Power meters are used by utility companies for measuring and providing a readout for the quantity of electricity that has been used in a commercial or residential establishment. Conventionally, if a person, such as a homeowner, wanted to monitor energy consumption, then the person would physically go outside to the location of the power meter to read the power meter. This process is labor intensive, can be subject to human error and in certain circumstances may not be safe for the person. Accordingly, there is a movement towards automatic power meter readers that integrate the capability of measuring the amount of electricity and communicating the measurement to the utility company using either wired or wireless signal transmission. However, automatic power meter readers are generally limited to newer power meter installations. Consequently, there is a need for a power meter reader that can be retrofitted to the various types of existing power meters.

Automatic power meter readers are typically retrofitted to existing power meters and are typically connected to the power lines power to obtain power. However, it would be more convenient to use one or more batteries for a power source; i.e. the automatic power meter reader would be easier to install since no connections to a power source would have to be made. Unfortunately, the operations that are carried out by the automatic power meter readers, such as detecting the rotation of the power meter disk and transmitting information related to power consumption of the structure are power hungry operations that would result in the frequent replacement of the batteries. This is inefficient and cumbersome. Accordingly, it would be advantageous to have a power meter reader that operates in an efficient manner for prolonging battery lifetime.

Another common issue for power utility companies is dealing with unsatisfied consumers who complain about their high electric bills. What is needed is technology that allows a consumer to know how much electricity they are consuming, in dollars and cents or kilowatt-hours, and how much their electric bill will be at the end of the month. The consumers can use the feedback on the amount of electricity that they are using to reduce high electric bills. There is also a growing pressure to increase energy efficiency, conserve energy resources and reduce atmospheric pollution. This can be achieved with increased consumer awareness of the amount of energy that they are consuming. In fact, studies show that energy savings of up to 15% or more is possible when consumers get enough information to make meaningful decisions about energy consumption.

SUMMARY OF THE INVENTION

The invention provides a detection unit that is mounted to the power meter unit and a display unit that is remotely located with respect to the detection unit; one possibility is to mount the display unit within the structure for which the power meter unit is monitoring energy consumption. The detection unit monitors the indication of power consumption on the power meter (which is usually the rotation of the power meter disk of the power meter) and provides information related to the power consumption to the display unit. The display unit then displays the power consumption information to a consumer who is responsible for the power consumption of the structure. The display unit can provide a variety of information such as power consumption in a kW/hr or in a dollar amount (or another foreign currency) as well as the greenhouse gas that is being emitted due to the power usage.

Advantageously, the detection unit provides one or more energy efficient features for reducing its own energy consumption. For instance, the detection unit can enter a sleep mode during certain time intervals while detecting the power consumption indicated by the power meter unit. Alternatively, or in addition, the detection unit can generate a prediction model that represents information related to the power consumption and transmit the prediction model parameters, rather than raw data, to the display unit which uses the prediction model parameters to show power consumption (this may be done in real-time). This reduces the amount of data that is transmitted to the display unit. This also reduces the amount of transmissions that are sent to the display unit since data need only be transmitted when the values of the prediction model parameters change.

The invention also provides an attachment means for attaching the detection unit to the power meter unit. The attachment means is adapted for allowing the detection unit to be attached to a wide variety of power meter units. In particular, the attachment means includes a clamping means that is fitted around the perimeter of the body of the power meter unit. The attachment means also includes an arm that houses a sensor unit for sensing the indication of power consumption of the power meter unit. The arm includes an extension means for extending the length of the arm so that the location of the sensor unit can be properly adjusted over an appropriate location on the power meter unit. The arm may also include a pivot means for angling the arm with respect to the main body of the detection unit.

In one aspect, the invention provides a power meter reader system for automatically reading a power meter unit mounted on a structure that is consuming power. The power meter unit includes an indication with a cyclical property having a period that varies at a rate indicative of power consumption of the structure. The system comprises a detection unit mounted on the power meter unit for monitoring the power consumption. The detection unit comprises a sensor unit disposed adjacent to the power meter unit for monitoring the cyclical property of the indication and generating a consumption detection signal; a processing unit connected to the sensor unit for receiving the consumption detection signal and generating an information signal, the processing unit further generating a sensor enable signal to enable the sensor unit for only a portion of the cyclical property of the indication, the portion coinciding with a time interval indicating the completion of one period of the cyclical property, the time interval being shorter than the period of the cyclical property; and, a transmitter connected to the processing unit for receiving the information signal and transmitting a transmission signal. The power meter reader system further includes a display unit located remotely with respect to the detection unit. The display unit receives the transmission signal and displays the power consumption.

In another aspect, the invention provides a power meter reader system for automatically reading a power meter unit mounted on a structure that is consuming power. The power meter includes an indication with a cyclical property having a period that varies at a rate indicative of power consumption of the structure. The system comprises a detection unit mounted on the power meter unit for monitoring the power consumption. The detection unit comprises a sensor unit disposed adjacent to the power meter unit for monitoring the cyclical property of the indication and generating a consumption detection signal; a processing unit connected to the sensor unit for receiving the consumption detection signal and generating an information signal, the processing unit including a prediction unit for generating values for prediction model parameters for predicting energy consumption data derived from the consumption detection signal and incorporating the values of the prediction model parameters into the information signal; and, a transmitter connected to the processing unit for receiving the information signal and transmitting a transmission signal. The power meter reader system further includes a display unit located remotely with respect to the detection unit. The display unit receives the transmission signal and displays the power consumption of the structure based on the prediction model parameters.

In yet another aspect, the invention provides a housing for a detection unit for automatically reading a power meter unit mounted on a structure that is consuming power. The power meter unit includes an indication with a cyclical property having a period that varies at a rate indicative of power consumption of the structure. The housing comprises a main body for housing internal electronics; an extension member connected to the main body, the extension member having a head region for housing a sensor unit; and, an attachment means connected to the main body for mounting the main body on the power meter unit.

In a further aspect, the invention provides a detection unit for use with a power meter unit mounted on a structure that is consuming power, the power meter unit including an indication with a cyclical property that varies at a rate indicative of power consumption of the structure. The detection unit is mounted on the power meter unit for monitoring the power consumption and comprises a sensor unit disposed adjacent to the power meter unit for monitoring the cyclical property of the indication and generating a consumption detection signal; and, a processing unit connected to the sensor unit for receiving the consumption detection signal and generating an information signal, the processing unit further generating a sensor enable signal to enable the sensor unit for only a portion of the cyclical property of the indication, the portion coinciding with a time interval indicating the completion of one period of the cyclical property, the time interval being shorter than the period of the cyclical property.

In yet another aspect, the invention provides a detection unit for use with a power meter unit mounted on a structure that is consuming power, the power meter unit including an indication with a cyclical property having a period that varies at a rate indicative of power consumption of the structure. The detection unit is mounted on the power meter unit for monitoring the power consumption and comprises a sensor unit disposed adjacent to the power meter unit for monitoring the cyclical property of the indicaiton and generating a consumption detection signal; and, a processing unit connected to the sensor unit for receiving the consumption detection signal and generating an information signal, the processing unit including a prediction unit for generating values for prediction model parameters for predicting power consumption data derived from the consumption detection signal and incorporating the values of the prediction model parameters into the information signal.

In another aspect, the invention provides a method for automatically reading a power meter unit mounted on a structure that is consuming power, the power meter unit including an indication with a cyclical property that varies at a rate indicative of power consumption. The method comprises:

a) sensing values for the cyclical property of the indication using a sensor unit and generating a consumption detection signal;

b) generating an information signal based on data from the consumption detection signal; and, c) generating a sensor enable signal to enable the sensor unit for only a portion of the cyclical property of the indication, the portion coinciding with a time interval indicating the completion of one period of the cyclical property, the time interval being shorter than the period of the cyclical property.

In a still further aspect, the invention provides a method for automatically reading a power meter unit mounted on a structure that is consuming power, the power meter unit including an indication with a cyclical property having a period that varies at a rate indicative of power consumption of the structure. The method comprises:

a) sensing values for the cyclical property of the indication using a sensor unit and generating a consumption detection signal; and, b) generating an information signal based on data from the consumption detection signal by generating values for prediction model parameters to predict power consumption data derived from the consumption detection signal and including the values of the prediction model parameters in the information signal.

BRIEF DESCRIPTION OF THE DRAWINGS

For a better understanding of the invention and to show more clearly how it may be carried into effect, reference will now be made, by way of example only, to the accompanying drawings which show an exemplary embodiment of the invention and in which:

FIG. 6b is a perspective view of the detection unit of FIG. 6a; and,

FIG. 6c is an exploded isometric view of the housing of a portion of the detection unit of FIG. 6a.

DETAILED DESCRIPTION OF THE INVENTION

Figure 1:
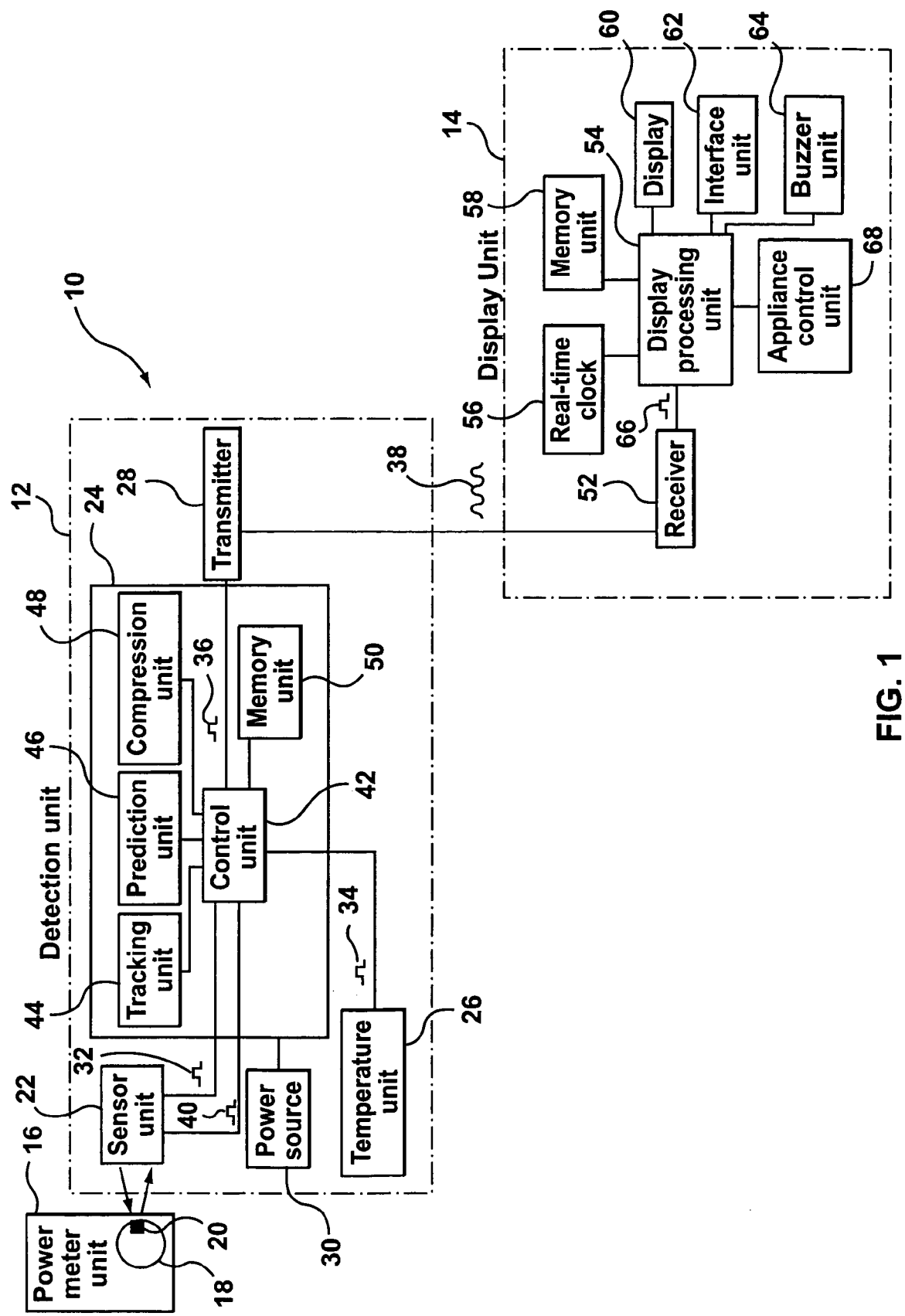
FIG. 1 is a block diagram of an exemplary embodiment of a power meter reader system in accordance with the invention.

In the following detailed description, numerous specific details are set forth in order to provide a thorough understanding of the invention. However, it will be understood by those of ordinary skill in the art that the invention may be practiced without these specific details. In other instances, well-known methods, procedures and components have not been described in detail so as not to obscure the invention.

Further, it will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Referring first to FIG. 1, shown therein is a block diagram of an exemplary embodiment of a power meter reader system 10. The power meter reader system 10 comprises a detection unit 12 and a display unit 14. The detection unit 10 is mounted to a power meter unit 16 and the display unit 14 is mounted in a convenient location within the structure for which the power meter unit 16 is monitoring power consumption. The detection unit 12 and the display unit 14 are preferably wirelessly coupled. However, the detection unit 12 and the display unit 14 may be hardwired to each other in known manner. The physical structure of the detection unit 12 and the manner in which the detection unit 12 is mounted to the power meter unit 16 are discussed in further detail below.

As is commonly known to those skilled in the art, the power meter unit 16 is typically mounted on the outside wall of the structure for which the power meter unit 16 is monitoring electrical power usage (the meter unit 16 may also be on the inside of the structure). The power meter unit 16 has a clear plastic or glass cover for allowing the power usage to be read while protecting the power meter unit 16 from the elements such as rain or snow and against possible tampering. The power meter unit 16 also has a power meter disk 18, shown schematically for illustrative purposes, which rotates at a speed that indicates power usage. The power meter disk 18 is oriented approximately perpendicular to the cover of the power meter unit 16 and has a black mark 20 that is in the shape of a small circular arc along the top and edge of the power meter disk 18. The power meter unit 16 also has a plurality of dials (not shown) that indicate the current electrical power usage of the structure. The dials rotate in accordance with the rate of rotation of the power meter disk 18.

It should be understood by those skilled in the art that the power meter unit 16 may be a digital power meter unit with an alternative indication of power consumption such as a digital representation of the power meter disk 18, or a vertical or horizontal bar on an LED with a mark that moves across the bar at the rate that the black mark on the power meter disk revolves. Other representations are also possible. The black mark 20 on the power meter disk 18 will hereafter be used in the description of the operation of the power meter system for ease of description. However, it should be understood that the black mark can generally be considered to be an indication having a cyclical property that has a period with a varying rate and that there are other types of power meters with other forms of indication as described above.

The detection unit 12 comprises a sensor unit 22, a processing unit 24, a temperature unit 26, a transmitter 28 and a power source 30. The sensor unit 22 detects the rotation of the power meter disk 18 and provides a consumption detection signal 32 to the processing unit 24 to indicate the rotation frequency of the power meter disk 18. The sensor unit is described in further detail below. The temperature unit 26 measures the outdoor temperature and provides a temperature signal 34 to the processing unit 24.

The temperature unit 26 is optional. However, it is preferable to include the temperature unit 26 for obtaining temperature information that can be used by the power meter reader system for augmenting the power consumption as is described in further detail below. The temperature unit 26 includes a temperature sensor, such as a thermister, and a resistor used to bias the temperature sensor (both not shown). The value of the resistor is preferably chosen to draw the least amount of current possible while still allowing the temperature sensor to provide a reading of the outside temperature. The temperature reading is a raw analog voltage level that is dependent on the outside temperature. The raw analog voltage level is sent by the transmitter 28 to the display unit 14 without any preprocessing. The display unit 14 then converts the raw analog voltage level to a temperature value. The display unit 14 performs the conversion to reduce the amount of processing that is done by the processing unit 24 and hence reducing the energy consumption of the detection unit 12.

The detection unit 12 includes one or more components for reducing power consumption as is described in further detail below. For instance, low voltage components are used to reduce power consumption. Further, the operating parameters of the detection unit are chosen to reduce power consumption. For instance, a low clock frequency, such as 32 kHz for example, is used for the processing unit 24. In addition, the operating voltage of the sensor unit 22, the processing unit 24, the temperature unit 26, and the transmitter 28 is reduced. Further certain components of the detection unit 12, such as the sensor unit 22, certain modules of the processing unit 24, and the RF circuitry of the transmitter 28 are placed into sleep mode when not in use. The sleep mode used for the sensor unit 22 is described in further detail below.

The processing unit 24 uses the consumption detection signal 32 and the temperature signal 34 as well as other information, as is described further below, for creating an information signal 36. The information signal 36 is sent to the transmitter 28 which generates and wirelessly transmits a transmission signal 38 to the display unit 14. The transmitter 28 modulates the information signal 36 for transmission at a suitable transmission frequency. The transmitter 28 is any suitable transmitter that has low current consumption and the ability to operate in a sleep mode. The transmitter 28 also preferably provides error correcting codes for encoding the information signal. Error correcting codes allows a certain amount of errors to be introduced during transmission, yet these errors can be corrected at the display unit 14. The benefit of such a transmission scheme is that the range for wireless transmission is increased for the same amount of power consumption. Alternatively, the power consumption can be reduced while still ensuring that the range for wireless transmission is sufficient. The transmitter 28 also provides data for a CRC check that can be used by the display unit 14 to throw out corrupt messages. This is beneficial since, as the power of the wireless transmission gets lower (i.e. the signal to noise ratio (SNR) gets lower), it is more likely that the wireless transmission can become corrupted. Since, reduced power consumption is a goal of the power meter reader system 10, transmission is preferably done at a low SNR. Consequently error correction codes and data for a CRC check is used to ensure that data is correctly received by the display unit 14.

The power source 30 provides power for the operation of the detection unit 12. The power source 30 is connected to the processing unit 24 which distributes the power to the remaining components of the detection unit 12. Preferably the power source 30 is a battery such as a 3.6V lithium AA battery for example.

The sensor unit 22 is physically positioned adjacent to the power meter disk 18 for detecting the rotation of the power meter disk 18. The sensor unit 22 comprises an IR emitting diode and at least one photo diode (described in more detail below). The IR emitting diode transmits a modulated light beam to the surface of the power meter disk 18. The modulated light beam is reflected by the power meter disk 18 at a certain level. However, when the modulated light beam encounters the black mark 20, the light beam is reflected at a lower level. Accordingly, the sensor unit 22 detects revolutions of the black mark 20 based on a lower amount of reflected light (this may also include the total absence of reflected light). The sensor unit 22 generates a pulse in the consumption detection signal 28 for each detection of the revolution of the black mark 20. The modulated light beam is modulated at a frequency of approximately 38 kHz so that sunlight can be filtered out by the sensor unit 22 (other suitable modulation frequencies may also be used). The use of modulation also reduces the power that is required by the sensor unit 22 since the modulation requires that the IR emitting diode is turned off for very brief periods of time. To further reduce energy consumption, the sensor unit 22 receives an enable control signal from the processing unit 24. Accordingly, the sensor unit 22 is only operational for a portion of the rotation of the power meter disk 18 which coincides with the passage of the black mark 20 past the sensor unit 22 (i.e. the sensor unit 22 is turned off until the black mark 20 is expected to return). This is described in more detail below.

The processing unit 24 controls the operation of the detection unit 12 such that the detection unit 12 operates in an energy efficient manner. In the exemplary embodiment of FIG. 1, the processing unit 24 includes a control unit 42, a tracking unit 44, a prediction unit 46, a compression unit 48 and a memory unit 50 (some of these components may be omitted in other embodiments as discussed further below). The control unit 42 directs the operation of the detection unit 12 to enable the activation of the sensor unit 22, to generate power meter disk rotation information, read outdoor temperature, generate packets of information to send to the display unit 14 and detect if the power source 30 is low. The processing unit 24 is implemented by any suitable, ultra-low power microcontroller with associated hardware and software.

The tracking unit 44 tracks the movement of the power meter disk 18 based on the current speed and the maximum acceleration of the power meter disk 18. The tracking unit 44 uses this information to dynamically set a sleep period for the sensor unit 22. The sleep period is provided to the control unit 42 each time the sleep period is updated. During the sleep period, the control unit 42 disables the operation of the sensor unit 22 via the enable control line 40 and enables the sensor unit 22 otherwise. The sleep period can be based on an estimate of the return time of the black mark 20 for the next revolution of the power meter disk 18. The return time of the power meter disk 18 can be estimated based on the last two detections of the black mark 20. Alternatively, the last detected revolution of the power meter disk 18 can be used to estimate the revolution rate of the power meter disk 18. For example, if the tracking unit 44 estimates that the last return time of the meter disk 18 took 2 seconds, then it is highly likely that the next cycle will be somewhere close to that same time period.

The kinematics of the power meter disk 18 can also be used to determine the minimum time required for the power meter disk 18 to make the next full revolution. The sleep period can then be chosen accordingly. Based on kinematics, the fastest revolution time for the power meter disk is given by equation 1:

$$t_f = t_c / (1 + \text{MAX\_DELTA} * t_c / 25920000) \qquad (1)$$

where $t_f$ is the fastest revolution time for the power meter disk 18, $t_c$ is the last time it took for one full revolution, MAX_DELTA is the value of watts "kicking" in during the next cycle (i.e. revolution of the power meter disk 18) and the value 25920000 is a constant. The constant is calculated by multiplying the kH factor of the power meter 16 (which is typically 7.2 Whr) with the amount of seconds in 1 hour and the constant 1000. The value of $t_c$ can be based on the average or instantaneous revolution speed of the power meter disk 18. There can be an array of values that can be used for MAX_DELTA. Some exemplary numbers for MAX_DELTA include 2000, 5000 or 10000. The particular value of MAX_DELTA that is used depends on the current revolution speed of the power meter disk 18. If the disk 18 is revolving at a slow speed, then a larger value of MAX_DELTA, such as 5000, can be selected because there are many devices that can be turned on to increase power consumption within the structure. However, if the disk 18 is revolving at a high speed, then a lower value of MAX_DELTA, such as 2000, can be selected. This allows for the selection of a longer sleep period without missing the next revolution of the black mark 20. This is effective at high power consumption levels associated with the structure (i.e. at fast revolution speeds for the power meter disk 18) since there aren't many more devices that can be turned on, or turned on at a higher level, in the structure to consume more energy and make the disk 18 revolve at a faster rate. However, at lower revolution rates, the sleep period cannot be set as long using this method.

In an alternative, the tracking unit 44 can set the sleep period according to a percentage of the last full revolution time of the power meter disk 18. For example, if the power meter disk 18 took 3 seconds for the last revolution and a 50% sleep period is set by the tracking unit 44, then the sensor unit 22 will sleep for 1.5 seconds after the last detection the black mark 20 and then "wake-up" to detect the next occurrence of the black mark 20. This form of tracking is somewhat adaptive in nature. For example, if the rotation of the power meter disk 18 slows down to 5 seconds per revolution, the control unit 22 will change the sleep period to 2.5 seconds. However, if the rotation of the power meter disk 18 speeds up, there is a potential for cycles to be missed. However, once the sensor unit 22 is turned back on it will adjust to the speed of the meter disk 18.

The percentage used to determine the sleep period can also be changed depending on the speed of the power meter disk 18. For instance, if the power meter disk 18 is rotating at a high speed, then the sleep period percentage can be set to a higher value such as 90%, for example. Alternatively, if the power meter disk 18 is rotating at a slower speed, then the sleep period percentage can be set to a lower value such as 50%, for example. Accordingly, when the power meter disk 18 transitions from a low revolution speed to a high revolution speed, a progressively higher sleep period percentage can be used. The rationale behind this is that at high rotation rates, the power meter disk 18 is unlikely to travel any faster since most of the devices in the structure that consume energy are already turned on which causes the power meter disk 18 to rotate at such a high rate. In this case, it is extremely unlikely that the power meter disk 18 will rotate any faster. Accordingly, setting a high sleep period in this case will most likely not result in any missed detections of the black mark 20. Alternatively, when the power meter disk 18 is rotating at a slow rate, it is quite likely that the power meter disk 18 can speed up quite quickly. Firstly, the inertia of the power meter disk 18 is low so that the power meter disk 18 can change speeds quickly. Secondly, and more importantly, since the power meter disk 18 is rotating at a slow speed, there are many devices that can be turned on, or alternatively turned on at a higher setting, which increases power consumption and therefore the speed of the power meter disk 18. This is even more pronounced depending on the time of day, when it is more likely that devices are turned on and off. Therefore, at low speeds, to avoid missing detections of the black mark 20, the sleep period is typically set to a lower percentage of the cycle time of the power meter disk 18.

Furthermore, in either a periodic or aperiodic fashion, the sensor unit 22 does not enter sleep mode during a complete rotation of the power meter disk 18, so that the sensor unit 22 can avoid becoming out of sync with the rotation of the power meter disk 18. For example, if a rotation of the power meter disk 18 is missed, the sensor unit 22 will not be aware of this and will assume that the revolution time of the power meter disk 18 is longer than it actually is and will add the extra time to the current revolution cycle. This may cause the sensor unit 22 to miss successive cycles. To avoid this, full cycle detection can be used at various times during the operation of the detection unit 12.

In another alternative, the tracking unit 44 can adjust the sleep period based on the time of day since the amount of power consumption, and hence the rotation speed of the power meter disk 18, can vary depending on the time of day. For instance, power consumption may decrease at night, and it also very unlikely that additional devices will turn on at night, so the sleep period can be set to a larger percentage of the rotation speed of the power meter disk 18 at night. In another alternative, the sleep period can be based on the last X (e.g. 100) revolution times for the power meter disk 18.

In another alternative, the tracking unit 44 can adjust the sleep period based on the amount of energy remaining in the power source 30. For instance, if the power source 30 is a battery and the control unit 42 detects a low amount of power remaining in the battery, then the sleep period can be extended to conserve power consumption by the detection unit 12 at the cost of reduced accuracy of counting the number of rotations of the power meter disk 18.

In each of the above cases, the tracking unit 44 also sets upper and lower limits for the sleep period. An upper sleep period limit is set so that the sensor unit 22 will not miss the detection of too many cycles should the rotation of the power meter disk 18 go from a very slow speed to a very high speed before the sensor unit 22 wakes up. The upper sleep period limit is set to be approximately half the minimum time the black mark 20 is in view of the sensor unit 22. This is based on the Nyquist rate for sampling the black mark 20 on the power meter disk 18 and ensures that the sensor unit 22 will be on often enough to detect the black mark 20 even for the fastest speed at which the power meter disk 18 can rotate. This limit is capped at approximately 90–95% of the revolution time for the power meter disk 18. Conversely, the lower sleep period percentage, which is used at low revolution speeds of the power meter disk 18, is set based on the fact that it is known that the power meter disk 18 can go much faster as there are more loads that are available to consume power and hence increase the rotational speed of the power meter disk 18. This limit is capped at approximately 50%.

The prediction unit 44 is used to alter the rate at which the transmitter sends the transmission signal 38 to the display unit 14. Accordingly, the data sent to the display unit 14 is not necessarily sent at a periodic rate. Rather, the prediction unit 44 uses prediction techniques to generate parameters for a prediction model that predicts the revolution of the power meter disk 18. The values of the model parameters are sent to the display unit 14 and the display unit 14 uses the values of the prediction model parameters to "simulate" the rotation of the power meter disk 18 and calculate future values of power usage in real-time. In particular, depending on the accuracy of the prediction model, the values of power usage are updated by the display unit 14 at the same rate that the power meter disk 18 is actually rotating. The usage of prediction model parameters advantageously allows the display unit 14 to show the current power consumption without the detection unit 12 using up the power source 30 by sending frequent transmissions to the display unit 14. Accordingly, the detection unit 12 reduces energy consumption since transmission occurs less often. However, it appears as if the display unit 14 is receiving a steady stream of data, since the display unit 14 is providing power consumption data of the structure in real-time, even though the data transmissions from the detection unit 12 are not periodic. Also, it should be understood that when each data transmission is received, the display unit becomes synchronized with the real number of cycles that have occurred since this information is provided by the detection unit 12. Another advantage of using a prediction model, is that the values of the prediction model parameters are transmitted rather than the actual data; this reduces the amount of data that is transmitted to the display unit 14 which also reduces the power consumption of the detection unit 12.

The values for the model parameters that are sent to the display unit 14 are updated when the model becomes out of sync with the readings taken by the sensor unit 22. For instance, when the prediction unit 46 determines that the prediction model has a prediction error $\epsilon_{pred}$ that is greater than a predetermined prediction error threshold, such as 1 kWh for example, the prediction unit 46 recalculates values for the prediction model parameters, based on the latest values of the consumption detection signal 32. The updated values of the prediction model parameters are then sent to the display unit 14. The prediction unit 46 can also set a minimum and maximum time period between transmissions so that the detection unit 12 does not send too many transmissions to the display unit 14 while at the same time communicating at a basic rate to let the display unit 14 know that the detection unit 12 is still operational. Exemplary minimum and maximum time limits for sending transmissions are 3 minutes and 20 minutes respectively. The effect of the minimal time period for transmissions can also be implemented by setting the prediction error low enough so that the prediction error may be violated in a short period of time.

The complexity and accuracy of the prediction model is based on the computing power of the processing unit 24, the type of prediction algorithm being used, the amount of data from the consumption detection signal 32 that is used for prediction, and the determinism of the data in the consumption detection signal 32. The complexity and accuracy of the prediction model is also governed by the amount of power that must be expended by the detection unit 12 while employing the prediction model; it is desirable for the power consumption of the detection unit 12 to be as low as possible. An example of a prediction model that can be used by the prediction unit 46 is given by equation 2:

$$\tilde{s}[n] = s[n-n_{lag}] + n_{lag} \cdot v \qquad (2)$$

where $\tilde{s}$ is the predicted power consumption in the structure, s is the actual power consumption in the structure, v is the velocity of the power meter disk 18 (based on the last k values of s), n is the current data index and $n_{lag}$ is the number of index points into the prediction. The velocity (i.e. rotational speed) is inversely proportional to the last revolution time of the power meter disk 18 and therefore proportional to the power consumption of the structure. In this sense, the velocity is the average velocity of the power meter disk 18. The velocity could also be based on the instantaneous velocity of the power meter disk 18 according to the equation 1 which is based on kinematics. The index n is in terms of discrete time. For example, for each interval of n, 3 seconds may have expired. For instance, n=1 means 3 seconds have passed. The value $s[n-n_{lag}]$ represents the last known power consumption value before the current version of prediction began. Accordingly, the prediction parameters that are transmitted for this prediction model are the absolute cycle count and the time for the last revolution.

The prediction model also employs a prediction error that is used to recalculate values for the parameters of the prediction model when the prediction error of the prediction model exceeds a certain level, such as, for example, $\epsilon_{pred}$=200 cycles or equivalently 10 cents based on a kh factor of 7.2 Whr and an energy rate of 7 cents per kWh. Other suitable examples of prediction model errors include $\epsilon_{pred}$=20 cycles (i.e. 1 cent) or 100 cycles (i.e. 5 cents).

The prediction model shown in equation 2 is referred to as a LAST prediction model since it is based on the velocity of the power meter disk 18 in the latest revolution. Another example for a prediction model that can be used is referred to as a LINEAR prediction model. Although the LAST prediction model is linear in that it uses the latest speed of the power meter disk 18 as the velocity, the LINEAR prediction model uses the difference in cycle count between successive transmissions of data and the elapsed time between the transmissions from the transmitter to calculate the velocity. The remainder of the LINEAR prediction model operates in the same fashion as the LAST prediction model.

Other classes of prediction models may also be used such as AR, MA, or ARMA models. Kalman filtering or other forms of tracking may also be used. Simple, nonlinear prediction models may also be used. However, it is preferable to use a prediction model that has low computational complexity for reducing the power consumption of the detection unit 12. This means that the order of the prediction model is high enough to give accurate results but low enough to avoid undue amounts of computational complexity.

The control unit 42 generates information for transmission. In one embodiment, the generated information includes:
 a) the time in milliseconds that it took for the last revolution of the power meter disk 18;
 b) the cycle count (i.e. the number of revolutions of the power meter disk 18 that have been counted by the detection unit 12);
 c) the voltage status of the power source 30;
 d) the outside temperature;
 e) a device address (the transmitter 28 has a unique address); and,
 f) cyclic redundancy check (CRC) data.

The model parameters that are sent from the detection unit 12 to the display unit 14 depend on the particular prediction model that is being used. One option is to base the prediction models on the cycle count, and the latest revolution time of the power meter disk 18 according to equation 2. The values for these parameters are given in elements a and b above. In this particular example, the display unit 14 can synchronize the displayed cycle count with the cycle count that is transmitted by the detection unit 12. The display unit 14 can then use the cycle count and the latest revolution time to predict future cycle counts until the next transmission is received. If on the next transmission, the display unit 14 has "over-predicted" and is displaying a higher consumption rate than the real corresponding cycle count, then one option is to not update the display unit 14 until the real energy consumption value "catches-up" to the predicted value. This is to prevent the display unit 14 from showing a lower consumption value after it had previously displayed a higher consumption value. If however the power meter disk 18 speeds up, then on the next data transmission, the display unit 14 will display a sudden "jump" in energy consumption.

The compression unit 48 receives the generated information and compresses this information to provide the information signal 36 which is then transmitted by the transmitter 28. The compression reduces the length of the generated information. As a result, the transmitter 28 does not expend as much energy in transmitting the information signal 36. This is beneficial since wireless communication can be a key cause of energy dissipation. However, there must be an acceptable balance between a reduction in the amount of data that is transmitted for reducing energy consumption and an acceptable level of information loss that is introduced by compression.

Alternatively, the compression unit 48 can be used to compress the raw data in the consumption detection signal 32 or a series of values for the prediction model parameters that have been calculated over a given time period. This is beneficial in the case where data transmissions from the detection unit 12 to the display unit 14 are not that frequent. This situation can arise when a consumer does not want real-time feedback but wants to review the energy consumption once a day or possibly once a week. In this case, the information provides resolution between successive data transmissions; i.e. the consumer can get an idea of the average energy consumption between successive data transmissions, however, by transmitting more information, the consumer can get an idea of what happened in energy consumption between the two transmission times and may see transient increases or decreases in energy consumption of the structure.

The compression unit 48 uses a compression method that is easy to compute using a standard low powered microcontroller. Any compression method that exceeds the memory capacity of the memory unit 50, the time between scheduled updates to the display unit 14, or the power to transmit the data is not effective. It should also be noted that if too much data is compressed and the message sent containing the information is lost or corrupted then there is no way to recover the data without resending the data. However, limitations of the memory unit 50 may prevent the resending of data. Further, the estimation of the power consumption due to the compression method is based on the number of bits needed to represent the compressed time series. The fewer the number of bits needed to represent the compressed time series, the less power required to transmit the same amount of information.

Several compression methods can be used to compress a time series such as, but not limited to, Wavelets, Fourier Transforms, Piecewise Linear Approximations and polynomials. In addition, once a compression method is selected, an acceptable compression error $\epsilon_{comp}$ is preferably specified. The compression error $\epsilon_{comp}$ represents the amount of information that can be reasonably lost due to compression. This allows the algorithm to compress the data such that when it is uncompressed the values are within $\epsilon_{comp}$ of the original data values. Once set, the prediction error $\epsilon_{comp}$ may be dynamically changed. However, it is preferable that the dynamic value of the prediction error never exceed the originally set $\epsilon_{comp}$ because this value specifies the maximum allowable error. In general, the greater the $\epsilon_{comp}$ the higher the compression rate that can be achieved and thus a greater reduction in power consumption.

In this case, the data to be compressed is power consumption data which is a time series x[n] that has a plurality of data elements in which the index n is a time index and the values associated with a time index is the current demand. if the data series is graphed, the area under is the graph is the power consumption. The demand can be calculated by multiplying the kH factor of the power meter unit 16 with the constant 3600 and dividing by the latest revolution time of the power meter disk 18 that is associated with the current time index. The success of a compression technique depends on the presence of an underlying deterministic process in the time series x[n]. An example of a compression algorithm is the following. The compression error $\epsilon_{comp}$ defines a maximum error in the compression algorithm. The algorithm begins with taking the first two raw data points without compression. These two data points are successive absolute cycle counts and the times at which they occur. From this a revolution time can be calculated (alternatively the kinematic equation can be used for the revolution time) and the demand is calculated as explained above. The demand and the time index is added to the compressed data series. The next demand point is repeatedly calculated and only added to the compressed data series if the absolute value of the magnitude of the demand point minus the magnitude of the previous demand point in the compressed data series is larger than the prediction error $\epsilon_{comp}$. If the absolute value of the difference is larger than the magnitude of the demand point and the corresponding time index is added to the compressed data series. This procedure continues until there are no more data points to compress. It should be understood that rather than save the demand value, the corresponding revolution time can be saved instead since these values are related to one another by a factor. In another alternative, the absolute cycle count at the time index may also be saved in the compressed data series. Also, rather than saving the value of the demand or revolution time, the delta (i.e. difference between the current demand or revolution time and the previous value) can be saved. The compression ratio (CR) that can be achieved is represented by equation 3:

$$CR = \frac{K(b_s + b_{tp})}{nb_s} \quad (3)$$

where K is the compressed sequence length; $b_s$ is the size of the sample in terms of bits; $b_{tp}$ is the size of the time index in terms of bits and n is the number of samples in the original time series prior to compression which represents the number of times that the rate of rotation of the power meter disk 18 is checked. The memory unit 50 is memory that is associated with the processing unit 12. The memory unit 50 is preferably an EEPROM. However, depending on the implementation of the processing unit 24, the memory unit 50 may be RAM or another suitable memory device that has low power consumption. The memory unit 50 is used to save important parameters that are needed for the operation of the detection unit 12 and that can not be lost should power to the detection unit 12 be removed. For instance, the memory unit 50 can save instructional code that the control unit 42 uses to control the operation of the detection unit 12. The memory unit 50 is also preferably used to save the absolute cycle count.

The tracking unit 44, prediction unit 46 and compression unit 48 operate independently of each other. Accordingly, alternate embodiments of the detection unit 12 can incorporate one or more of these units and it is not necessary that the detection unit 12 contain each of these units. However, the greatest amount of reduction in energy consumption for the detection unit 12 is achieved when the detection unit 12 contains all of these units. However, if both compression and prediction are used, if the compression error $\epsilon_{comp}$ is equal to the prediction error $\epsilon_{pred}$, then there is no benefit to compression because the values of the prediction model parameters will be updated often enough to allow the display unit 14 to construct the same representation of the data that compression would have constructed. It is therefore necessary to set the prediction error $\epsilon_{pred}$ higher than the compression error $\epsilon_{comp}$. Effectively, this means that data for a certain amount of time (Tc) is compressed and that the data is transmitted every (Tp) seconds due to the amount of prediction error that is tolerated and that Tp is greater than Tc (i.e. having a larger prediction error allows one to use the same values for the prediction model parameters for a longer period of time, since over time the prediction error will accumulate).

The display unit 14 comprises a receiver 52, a display processing unit 54, a real-time clock 56, a receiver memory unit 58, a display 60, an interface unit 62, a buzzer unit 64 and an appliance control unit 68. Some of these elements may be optional such as the buzzer unit 64, the appliance control unit 68 and the real-time clock 56 if another means can be obtained to provide time. The display unit 14 may be plugged into a wall receptacle to receive power from the mains supply or the display unit 14 may have an internal power source such as a battery (not shown) that is connected in known manner.

The receiver 52 receives the transmission signal 38, performs the necessary demodulation and pre-processing, as is commonly known to those skilled in the art, and generates a received signal 66 that is similar to the information signal 36. Data will typically be sent in data packets in the transmission signal 38. During the generation of the received signal 66, the receiver 52 checks the device address data in the received data packets to ensure that the transmission signal 38 was received from the appropriate transmitter 28 and not from a transmitter of a different power meter reader system. If the receiver 52 determines that the transmission signal 38 was provided by the transmitter 28 of a different power meter reader system, then the receiver 52 will discard the received data packets. The receiver 52 also checks the CRC data in the data packets of the transmission signal 38 to make sure that data integrity is maintained during transmission. If a discrepancy is found in the CRC data, there is an error in the data packets of the transmission signal 38 and the receiver 52 discards these data packets. Further, continuously "listening" for the transmission signal 38 is power consuming. Accordingly, the transmitter 28 and the receiver 50 preferably employ unidirectional communication from the transmitter 28 to the receiver 52.

The receiver 52 provides the received signal 66 to the display processing unit 54 for further processing. The display processing unit 54 extracts the time for the last revolution of the disk and the cycle count, and uses the same prediction model that was used by the prediction unit 46 (if prediction is employed) to display the instantaneous demand in Wh or kWh or $/hr (rather than dollars another appropriate form of currency can be used depending on the country in which the power meter reader system is being used). The display processing unit 54 also uses this information to display a disk on the display 60 that spins at the same rate as the power meter disk 18. The display processing unit 54 also extracts the power source voltage status information and the temperature reading to display this information on the display 60. If the power source voltage is low, then the display processing unit 54 will display a battery low symbol on the display 60.

The display processing unit 54 uses the prediction model parameters to predict the amount of energy consumption that occurs until the next data transmission from the detection unit 12. In one example, the detection unit 12 sends over the absolute cycle count (which is never reset in the detection unit 12) and the last revolution time. The receiver uses these two values to predict the occurrence of successive revolutions of the power meter disk 18.

The display processing unit 54 can also allow the consumer to predict energy consumption for a specified time into the future, and also has the ability to store a history of energy consumption in the memory unit 56. Accordingly, the display processing unit 54 employs prediction on a longer time scale to allow the consumer to predict energy consumption for the next billing cycle (i.e. 30 days) for example (a similar prediction model can be used as those previously described except with a longer time period). The long term prediction (i.e. long-range bill prediction) can use linear regression based on the energy consumption in the last several days (i.e. the energy consumption is saved daily by the display unit 14) to predict the amount of the future energy bill.

The display processing unit 54 can also use the revolution count information to display the amount of greenhouse gas that the structure, which consumes the power, is responsible for emitting. This calculation is based on the region in which the structure is located since it is based on carbon-dioxide emission rates which are specific for a particular region or utility company. In particular, the display processing unit 54 can show the amount of carbon-dioxide that has been emitted in terms of tones, pounds or kilograms. Alternatively, the display processing unit 54 can display environmental credits/token/units that have been accumulated, used or that are remaining. These tokens may be distributed by the government or an environmental agency. The display processing unit 54 may also display a warning signal to notify the user of excess consumption; this may include but is not limited to a graphic on the display 60 such as a smoke stack, a sad face and/or a beep provided by the buzzer unit 64. The carbon-dioxide emission rates based on the province, state and/or country in which the power meter reader system 10 is used can be pre-programmed into the display processing unit 54. The consumer can then simply select their location on the display unit 14.

The real-time clock 56 is used to maintain time in the display unit 14. The time is received by the display processing unit 54 for computing the current time and displayed on the display 60. The time is also used by the display processing unit 54 in conjunction with Time of Use Energy Rates. For instance, depending on the particular utility company, the consumer may be charged different rates for energy consumption depending on the time of day when the energy is consumed. This is done to reduce energy consumption at peak times. For example, between 5 PM and 8 PM. a utility company may charge 10 cents/kWh rather than 6 cents/kWh so that the consumer reduces energy consumption between 5 and 8 PM.

The memory unit 58 can be any suitable memory device such as an EEPROM. The memory unit 58 is used to store critical information so that the display unit 14 can be powered down and powered back up without losing important information. Examples of critical information include different rates for energy consumption based on location, the cumulative energy consumed, the number of days to use for long-range bill prediction, etc.

The display unit 60 can be any suitable display device such as an LCD. The display unit 60 is used to display time and date information, power consumption in dollar amounts (or other currency), or other consumption units such as kWh, carbon-dioxide emission levels, and a disk that spins at the same rate as the power meter disk 18 as well as other information. The display unit 60 is described further below in an exemplary embodiment.

The interface unit 62 can be a keypad or similar device which allows the user to enter information into the display unit 14 or to choose between various modes of operation. The buzzer unit 64 provides an audible sound to provide various information to the consumer. For instance, the buzzer unit 64 may sound an alarm when the voltage level of the power source 30 of the detection unit 12 is running low. The buzzer unit 64 can also provide a sound to verify that the consumer has depressed a key on the interface unit 62. Any suitable buzzer can be used.

The appliance control unit 68 can be used in conjunction with the information that is provided by the detection unit 12 to direct the operation of appliances within the structure for which energy consumption is being monitored. The appliance control unit 68 is connected to the structure's powerline to send appliance control signals to the appliances via a powerline communications device. Any suitable powerline communications device can be used such as the X10™ or CEBUS™ powerline devices. The appliances have a corresponding receiver module with a unique address. Accordingly, the appliance control unit 68 can send specific control instructions to a particular appliance. These control instructions can direct the appliance to turn on, turn off, to increase an operational setting or decrease an operational setting. For example, the appliance can be an air conditioner and a control instruction may be to decrease the amount of cold air provided by the air conditioner.

In use, the appliance control unit 68 receives at least one of temperature information, energy consumption information and time information from the display processing unit 54 and uses this information to control an appliance. For instance, based on temperature information, and depending on the season and the particular temperature, the appliance control unit 68 can instruct a heating or cooling appliance to increase or decrease its operational setting. Alternatively, based on energy consumption, the appliance control unit 68 may instruct several appliances to turn off to conserve energy if the current level of energy consumption is too high. In another alternative, based on the time of day, the appliance control unit 68 can instruct one or more appliances to turn off. For instance, some utilities charge a higher rate during peak periods to encourage consumers to consume less energy: During these times periods, the appliance control unit 68 can instruct some of the more power hungry appliances to turn off. Of course, these instructions are within reason; i.e. it is not reasonable to turn off a fridge since the contents within the fridge may spoil. Rather than having the appliances turn off, the appliance control unit 68 can alter the operation level of the appliances.

Figure 2:
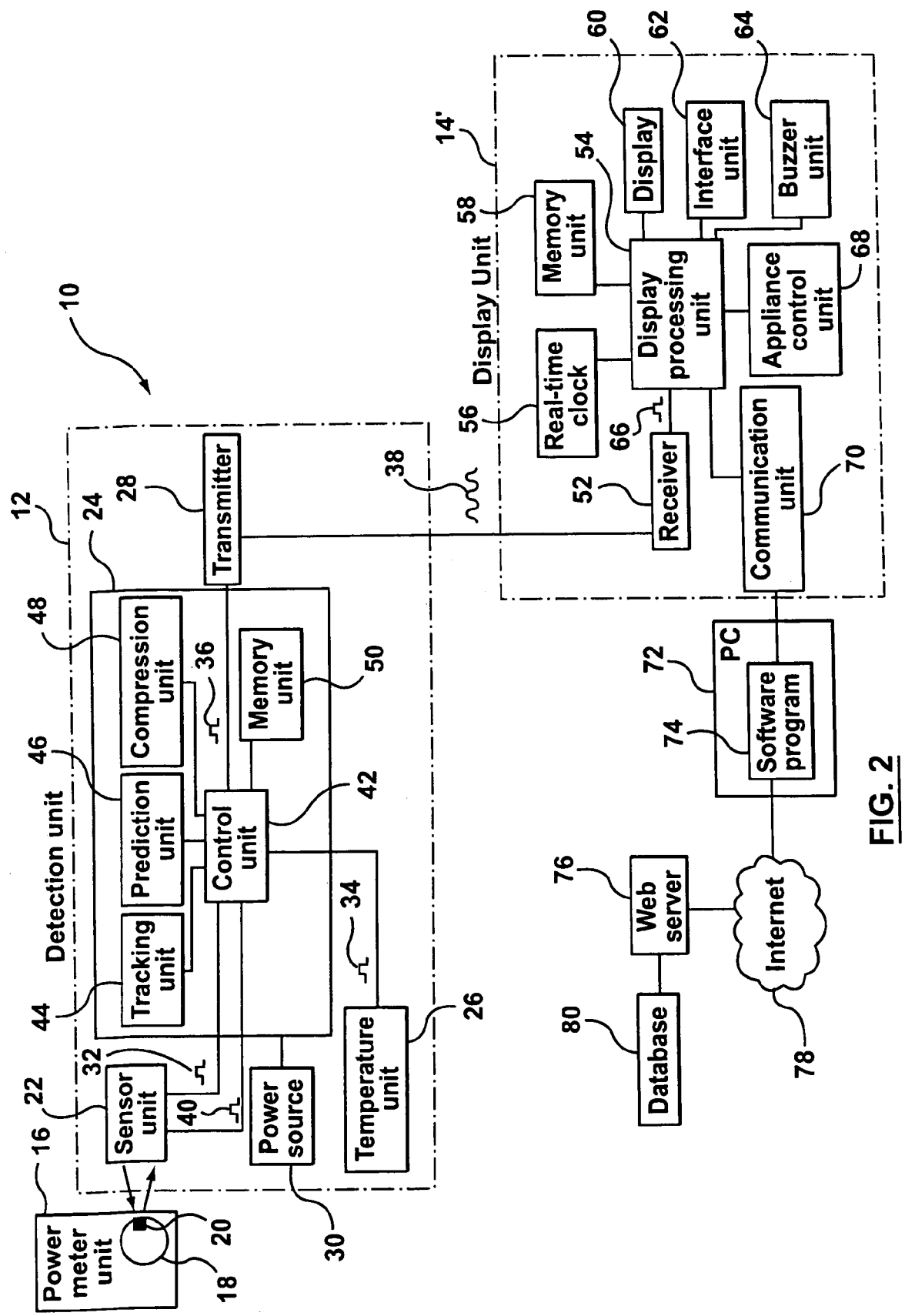
FIG. 2 is a block diagram of another exemplary embodiment of a power meter reader system in accordance with the invention.

Referring now to FIG. 2, shown therein is a block diagram of another exemplary embodiment of a power meter reader system 10' with an alternative display unit 14'. In this case, the display unit 14' includes a communication unit 70 for communicating with a computing device such as a PC 72. The communication unit 70 can be an RS232 data interface, a USB port or any other suitable communication device. The PC 72 can be connected to the display unit 14' and runs a utility software program 74 to interact with the receiver 52. The software on the PC 72 can be used to upload the history of energy consumption from the display unit 14' so that the consumer can make graphs, etc. to determine when the most energy is being consumed. It should be understood by those skilled in the art that another appropriate computing device can be used rather than a PC.

The consumer can also use the PC 72 to connect with a website provided by a utility web server 76 over the internet 78. The consumer may browse the web site to view utility rates, view consumption patterns and get energy saving hints and green house gas information. The utility web server 76 would obtain this information from an associated utility database 80. The consumer can also download carbon-dioxide information from the website and provide this information to the utility software program 74 which then passes this information to the display unit 14'.

Figure 3:
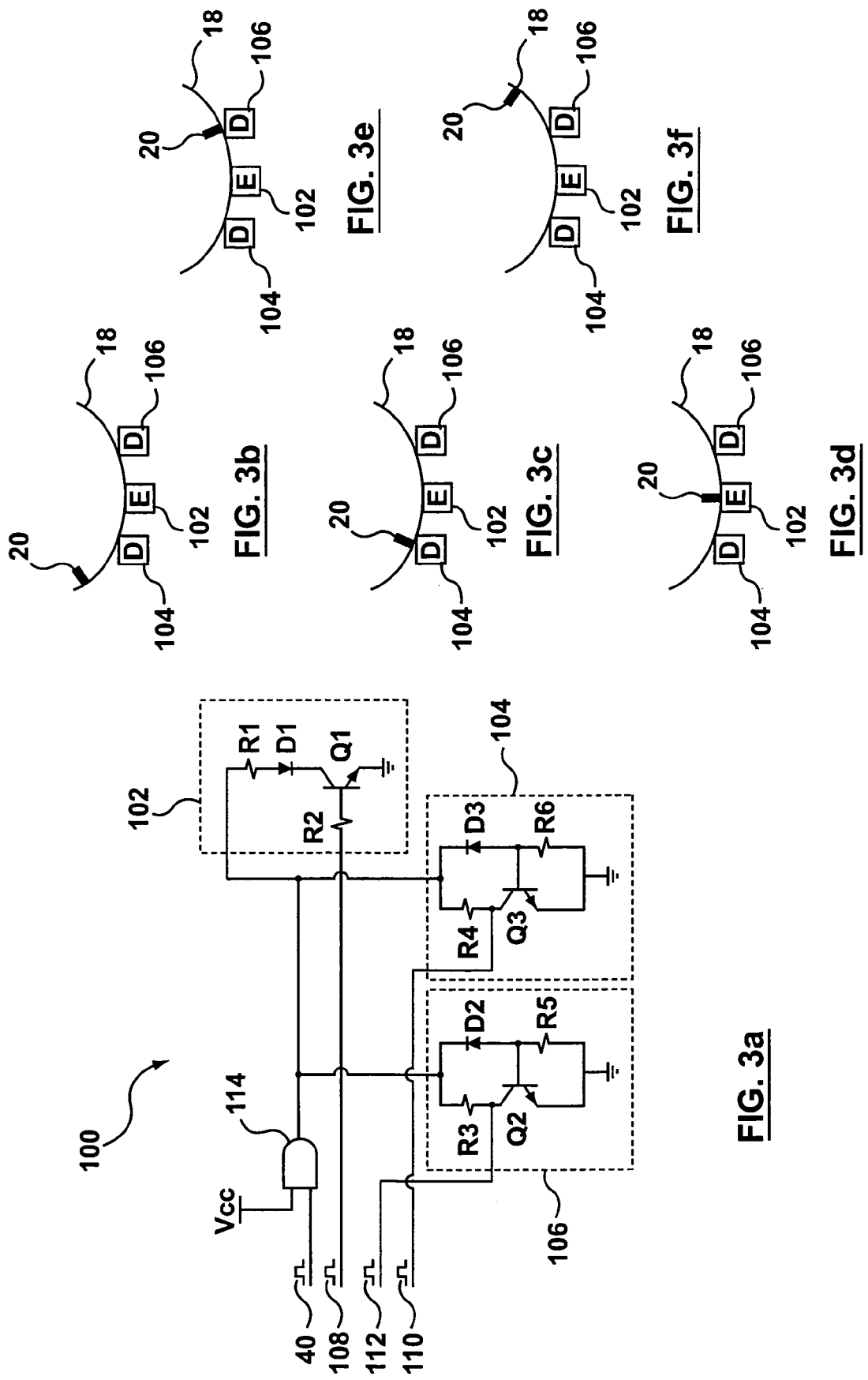
FIG. 3a is a schematic of an exemplary embodiment of a sensor unit that can be used in the power meter reader systems of FIGS. 1 and 2.
FIGS. 3b–3ff are a series of illustrations of the operation of the sensor unit of FIG. 3a with respect to the motion of the black mark on the power meter disk.

Referring now to FIG. 3a, shown therein is an exemplary embodiment of a sensor unit 100 that can be used with both of the power meter reader systems 10 and 10'. The sensor unit 100 comprises an emitter 102, a first detector 104 and a second detector 106. In this embodiment, two detectors are used to make the sensor unit 100 more robust to false detections as well as ambient light. Furthermore, in this embodiment, the sensor unit 100 receives a polling signal 108 from the control unit 42 as well as the enable control signal 40. The sensor unit 100 also provides first and second detection signals 110 and 112 that are combined to form the consumption detection signal 32. In terms of physical layout, the emitter 102 is located between the first detector 104 and the second detector 106 (this is illustrated in FIGS. 3b–3f and discussed in more detail below).

The enable control signal 40 is combined with the VCC power supply signal in a logical AND operation by the AND gate 114. Accordingly, when the enable control signal 40 is high, the VCC power supply signal is provided to the remainder of the circuitry of the sensor unit 100 thereby enabling the sensor unit 100. Otherwise, the sensor unit 100 is in sleep mode with no power consumption. Alternatively, rather than having the AND gate 114, other suitable devices may be used such as a CMOS transistor or a more complex transmission gate. It should be understood that capacitors to ground can be connected in parallel with VCC to remove noise.

In an alternative, the AND gate 114 can be replaced by a transmission gate; i.e. a CMOS transistor for example, can be used. Alternatively, the VCC power supply signal can be provided by a pin on a microcontroller if a microcontroller is used to implement the control unit 42 and a sufficient amount of current can be provided by the pin.

In this exemplary embodiment, the emitter 102 comprises a light emitting diode (LED) D1 connected in series with a resistor R1 and a transistor Q1. The resistor R1 is connected to the output of the AND gates 114 and to a first node of the LED D1. The other node of the LED D1 is connected to the collector of the transistor Q1 and the emitter of the transistor Q1 is connected to ground. The base of the transistor Q1 is connected to a first node of a resistor R2. The other node of the resistor R2 is connected to the polling signal 108. In use, when the sensor unit 100 is enabled and the polling signal 108 is pulsed high, the transistor Q1 is turned on and conducts current which allows the LED D1 to emit light. The LED D1 is selected such that it emits infrared light. The LED D1 may emit modulated IR light at a frequency of 38 kHz for example although other modulation frequencies may be used such as 2 kHz for example. The detection signals 110 and 112 are then filtered by a bandpass filter that has a passband that matches the modulation frequency used to emit the IR light. The bandpass filtering can be done in hardware (not shown) or via software by a unit within the processing unit 24.

The first detector 104 and the second detector 106 are preferably implemented to have the same structure so that the first and second detection signals 110 and 112 are similar to one another. Accordingly, only the first detector 104 will be described. The first detector 104 comprises a photodiode D3 connected in series with a resistor R6. A first node of the photodiode D3 is connected to the output of the AND gate 114 and a second node of the photodiode D3 is connected to the resistor R6. The other node of the resistor is connected to ground. The series combination of the photodiode D3 and the resistor R6 is connected in parallel with a series combination of a resistor R4 and a transistor Q3. A first node of the resistor R4 is connected to the output of the AND gate 114 and a second node of the resistor R3 is connected to the collector of the transistor Q3. The base of the transistor Q3 is connected to the second node of the photodiode D3. The emitter of the transistor Q3 is connected to ground.

In use, when the sensor unit 100 is enabled and the polling signal 108 is pulsed high, the LED D1 emits IR light that is reflected by the shiny surface of the power meter disk 18. In this case, the black mark 20 has not come into the vicinity of the LED D1 or the photodiode D3. Accordingly, the photodiode D3 is conducting, the transistor Q3 is turned on and current flows through resistor R4. Accordingly, there is a voltage drop across the resistor R4 and the voltage at the emitter of the transistor Q3 is relatively constant and has a low magnitude with respect to the power supply voltage VCC. However, when the LED D1 shines IR light on the black mark 20, not as much energy is reflected by the power meter disk 18. Consequently, the photodiode D3 turns off, no current flows through the resistor R6 and the transistor Q3 turns off. Accordingly, only a small amount of current flows through the resistor R4 and a high voltage with respect to the power supply voltage VCC is seen at the emitter of the transistor Q3 and hence in the first detection signal 110.

Referring now to FIGS. 3b–3f, shown therein is an illustration of the operation of the sensor unit 100. The LED D1 and the photodiodes D2 and D3 are oriented with the photodiodes D2 and D3 on either side of the LED D1. These elements are spaced according to the angular extent of the black mark 20 which is typically 5 degrees or so. In one exemplary embodiment, these elements are separated by approximately 3 or 4 mm. This spacing is also chosen to ensure that reflections from small black specks on the power meter disk 18 will not trigger both photodiodes. In addition, these elements have a plastic shield between them so that light from the LED D1 does not go directly to either photodiode D2 or D3. Further, the voltage from each photodiode D2 and D3 can be subtracted from one another to cancel out any common mode voltage caused by IR going directly to the photodiodes.

FIG. 3b includes a series of panels that depict the different cases for the location of the black mark 20 on the power meter disk 18 with respect to the location of the emitter 102 and the first and second detectors 104 and 106. These five cases are represented by a state machine with five corresponding states. The state machine is implemented in the control unit 42. FIG. 3b shows the case where the black mark 20 has yet to reach the emitter 102 and the first and second detectors 104 and 106. In this case, the output of the first and second detectors is a low logic level (i.e. 0). FIG. 3c shows the case where the black mark 20 is close to the emitter 102 and the first detector 104 but not the second detector 106. Consequently, the output of the first detector 104 is a high logic level (i.e. 1) and the output of the second detector 106 is a low logic level. FIG. 3d shows the case where the black mark 20 is close to the emitter 102 and the first and second detectors 104 and 106. In this case, the outputs of the first detector 104 and the second detector 106 are both a high logic level. FIG. 3e shows the case where the black mark 20 is close to the emitter 102 and the second detector 106 but not the first detector 104. In this case, the output of the first detector 104 is a low logic level and the output of the second detector 106 is a high logic level. FIG. 3f shows the last case in which the black mark 20 is far from the emitter 102 and the first and second detectors 104 and 106. In this case, the outputs of the first and second detectors 104 and 106 are both low logic levels. Accordingly, based on the outputs of the first and second detectors 104 and 106, the passage of the black mark 20 can be detected. In particular, the consumption detection signal 32 can be based on the logical AND of the first and second detection signals 110 and 112.

The use of two detectors allows for more robust operation of the sensor unit 100 and less false detections. For instance, there may be spurious detections by either the first detector 104 or the second detector 106 which may be due to dirt on the power meter disk 18 and the like. However, it is very unlikely that both detectors 104 and 106 will give a spurious detection at the same time. Furthermore, it is very unlikely that noise will trigger a detection if one requires that all five states happen sequentially before making a detection of the passage of the black mark 20 by the sensor unit 100.

In an alternative, the five states can be reduced to three states by subtracting the first and second detection signals 110 and 112 from one another and noting the change in sign in the subtraction signal. For instance, the subtraction result for each of the five states, beginning with the first state and moving sequentially to the last state and subtracting the second detection signal 112 from the first detection signal 110, is 0, 1, 0, −1 and 0. Accordingly, the transition from 1 to 0 to −1 signifies the passage of the black mark 20 past the sensor unit 100 and makes it very unlikely that glitches or noise will result in a false detection.

Figure 4:
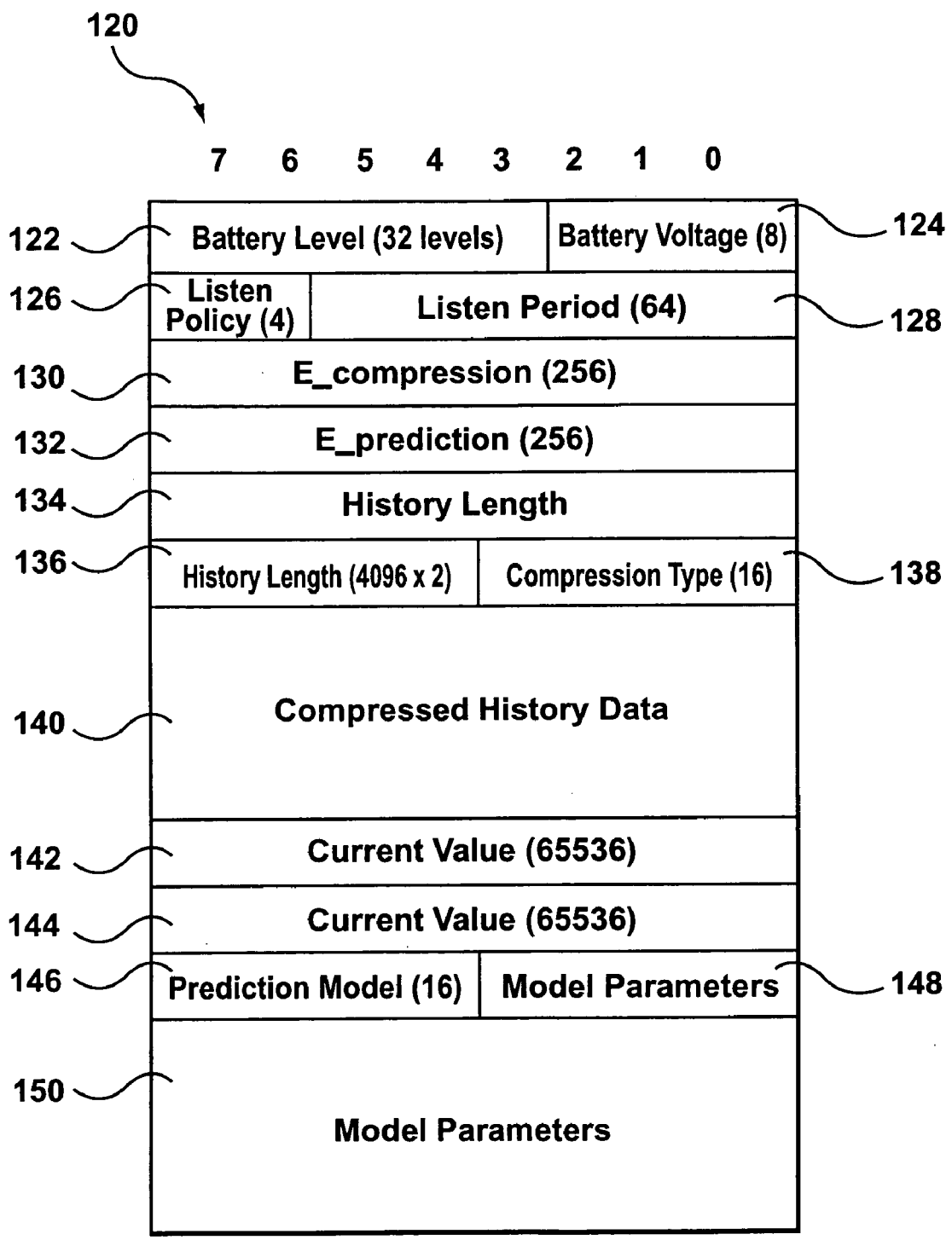
FIG. 4 is shows a data structure that may be used for transmitting data in the power meter reader systems of FIGS. 1 and 2.

Referring now to FIG. 4, shown therein is an example of a general transmission data structure 120 that may be used for transmitting data in either of the power meter reader systems 10 and 10'. This transmission protocol can be useful when the display unit is configured to interact with more than one detection unit (i.e. monitor the energy consumption of more than one structure) wherein each detection unit can operate in a different manner. In addition, other transmission data structures may be used that only have a portion of the fields contained in the transmission data structure 120. All efforts have been made to reduce the complexity and overhead of the transmission data structure 120 to reduce energy consumption in the detection unit 12. The transmission data structure 120 will not be effective if the overhead to transmit the data is greater than the data itself. The numerals 7 through 0 at the top of FIG. 4 signify the number of bits that are used to make up a particular piece of information in the transmission data structure 120.

The transmission data structure 120 comprises a battery level field 122, a battery voltage field 124, a listen policy field 126, a listen period field 128, an E_compression field 130, an E_prediction field 132, a history length 134, a first history length field 136, a second history length field 138, a compressed history data field 140, a first current value field 142, a second current value field 144, a prediction model field 146, a first model parameters field 148 and a second model parameters field 150. The battery level field 122 is sent for all transmissions made to the display unit 14. The battery level can be used to warn the end user of the display unit 14 that the detection unit 12 is getting low on power. Although some batteries have a sharp voltage drop curve as battery power dissipates, most batteries will give fair warning that they are getting low on power. The battery level field 122 is composed of 5 bits allowing for 32 distinctive levels of the battery voltage based on a linear scale.

The battery voltage field 124 shows an initial battery voltage for the power source 30. The initial battery voltage can be represented by eight values (i.e. 3 bits provide 000 sequentially through to 111). As an example, the following voltage levels can be represented: 1.2V, 1.5V, 2V, 2.4V, 3V, 3.6V, 4V and 6V. The initial battery voltage may also be coded in the display processing unit 54 since it is quite likely that the size of the battery used with the detection unit 12 is known a priori. However, there may be several different styles of detection units 12 that can use different size batteries.

The listen policy field 126 indicates to the display unit 14 when to listen for messages from the detection unit 12. In an unpredictable scheme where transmission occurs whenever the prediction error value $\epsilon_{pred}$ is violated, the policy for the display unit 14 will most likely be set to always listen for transmissions. However, the detection unit 14 could set a short transmission window and only be able to broadcast during this time window (as set in the policy). In this case, the detection unit 12 has the option of whether to send data, set a new listening policy or do nothing at all during each window. However, if the detection unit 12 detects a violation of the compression error $\epsilon_{comp}$ too often and is running out of memory to store the data or the prediction error $\epsilon_{pred}$ is violated, the detection unit 12 has to wait for the next transmission window to send data. In the worst case this could result in erroneous data predicted by the display unit 14 and/or a loss of data by the detection unit 12. The detection unit 12 must also be careful not to set too long of a transmission period as memory overflow may occur in the detection unit 12 and data will be lost. The display unit 14 could use the policy to identify potential interference between multiple detection units 12 (i.e. two or more detection units that want to broadcast at exactly the same time). It would then be up to the display unit 14 to take the appropriate action to resolve the conflict. Although in a unidirectional communication situation it may be difficult to resolve the conflict without human intervention (in this case, the consumer would shut down the detection unit 12 and the display unit 14 to reset these units). As shown in Table 1, the policy could be to broadcast every n Minutes, n Hours or n Days, where n is defined by the listen period field 128. If the listen policy field 126 is set to a time period of Minutes, Hours or Days then the 6 bits in the listen period field 128 allow for a listening period between 1 and 64 of the specified time period (i.e. 1 to 64 minutes, 1 to 64 hours or 1 to 64 days).

TABLE 1

Values for the Listen Policy Field

| Code | Policy |
|------|--------|
| 00 | Always |
| 01 | Minutes |
| 10 | Hours |
| 11 | Days |

The E_compression field 130 specifies the amount of compression error $\epsilon_{comp}$ between true sensor readings and the compressed values in the data that is transmitted. This value can range from 0 in the lossless case to up to 255 for a very lossy compression scheme. The value in the E_compression field 130 can be dynamically decided upon by the compression unit 48 during compression.

The E_prediction field 132 specifies the amount of prediction error $\epsilon_{pred}$ between the predicted values, due to the prediction model, and the actual values before updated values for the model parameters are transmitted by the detection unit 12 to the display unit 14. This value can range from 0, which is the case where any violation of the prediction will result in a transmission, up to 255. The value in the E-prediction field 132 can be dynamically updated by the prediction unit 46. For example, if the power source 30 is running very low, then this value may be increased so that fewer transmissions are made by the detection unit 12. However, it is important that the display unit 14 is aware of any possible error in the predicted values of energy consumption so that the consumer can be properly notified via a graphical output on the display 60.

The first and second history length fields 134 and 136 represent the length of data in the compressed history data field 148. The first and second history length fields 134 and 136 are specified by 12 bits in total to represent data lengths from 0 to 4096 data points. The minimum length 0 is specified when there is no data that is transmitted.

The compression type field 138 consists of 4 bits and specifies the type of compression used for the data in the compressed history data field 140. For example, if the first bit in the compression type field 138 is a 1, the delta of the predicted series and the compressed series is compressed. Alternatively, if the first bit of the compression type field 138 is a 0, then the raw sensor values are compressed. For different segments of a time series, different compression schemes may work better. Accordingly, the compression unit 48 can pick the best compression algorithm for a given potion of data and represent the particular compression algorithm in the compression type field 138. However, memory limitations in the detection unit 12 may not allow large blocks to have variable compression schemes. The various compression schemes that can be used are represented in table 2 (currently two entries are reserved for using other different types of compression). The entry NONE indicates that no compression is used.

TABLE 2

Types of data compression

| Code | Compression |
|------|-------------|
| 0000 | NONE |
| 0001 | PMC-Raw |
| 0010 | Reserved |
| 0011 | PMC-Delta |
| 0100 | Reserved |

The compressed history data field 140 is the compressed data that is collected by the detection unit 12. The length of the data in the compressed history data field 100 is specified in the history length fields 134 and 136 (to a max of 8192 bytes) and the type of compression used is specified in the compression type field 138. As mentioned previously, the data in the compressed history data field may be a series of values for the prediction model parameters or may be the actual raw data. This is useful in situations where the system 10 or 10' is configured for long times in between data transmissions. For example, this may be once per day and the consumer does not want real-time updated data but the consumer does want to see what happened with power consumption at various times during the day.

The current value fields 142 and 144 represent the latest absolute non-compressed current reading from the detection unit 12. This value represents the cycle count up to (i.e. absolute cycle count) the latest detected revolution of the power meter disk 18 prior to the current data transmission. If a time index is necessary, then the time index should be added to the data in the compressed history field 140.

TABLE 3

Meanings for values in the Current Value Fields

| Code | Meaning |
|------|---------|
| 0x0000 ... 0xFFFE | Sensor Reading |
| 0xFFFF | No value |

The prediction model field 146 indicates the type of prediction model used by the display unit 14 to predict the values between transmissions from the detection unit 12. Exemplary representations in the prediction model field 146 are shown in Table 4. The entry NONE indicates that no prediction is used.

TABLE 4

Meanings for values in the Prediction Model Field

| Code | Prediction |
|------|------------|
| 0000 | NONE |
| 0001 | Last |

TABLE 4-continued

Meanings for values in the Prediction Model Field

| Code | Prediction |
|------|------------|
| 0010 | Linear |
| 0011 | Reserved |

The model parameters field 148 provides the values for the prediction model parameters that were generated by the prediction unit 46 according to the chosen prediction model. However, if the prediction model field 148 specified that the prediction model is NONE, then all but the first four bits of this message will be encoded.

The transmission data structure 120 shown in FIG. 4 gives no indication of the error-correcting code (ECC) that is to be used during data transmission. A strong ECC will have to be used in the case of unidirectional communication if the detection unit 12 does not resend its information. Otherwise the data sent by the detection unit 12 may not be recoverable. Some examples of ECC include convolutional encoding and checking such as VITERBI algorithms. The ECC works with an error detection code. In one instance, CRC data can be added to the data transmitted and then used at the receiver to provide error checking on the transmitted data. First the ECC is used to fix potential errors but if there are more errors than can be corrected the CRC is a fail safe mechanism to throw out the message.

Figure 5:
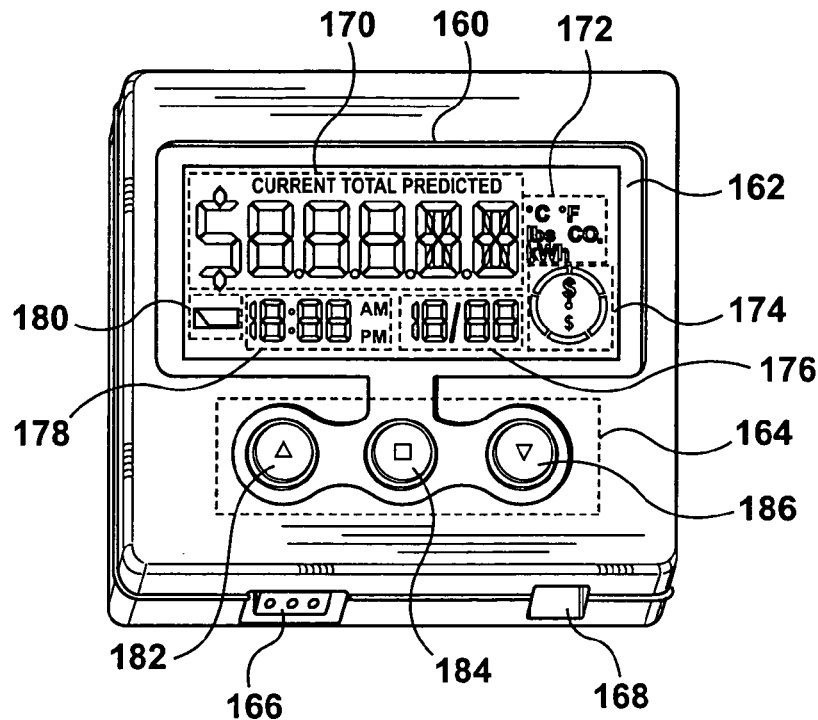
FIG. 5 is a front view of an exemplary physical embodiment of a display unit that can be used with the power meter reader systems of FIGS. 1 and 2.

Referring now to FIG. 5, shown therein is a front view of an embodiment of the display unit 160 that can be used with either of the power meter reader systems 10 and 10'. The display unit 160 includes a display 162, a keypad 164, a communication port 166 and a power connection port 168. The display 162 includes a number of display fields: a quantity display field 170, a unit display field 172, a power meter disk display field 174, a date display field 176, a time display field 178 and a low battery indicator field 180. The quantity display field 170 displays a numerical quantity such as the quantity of power consumption or the temperature. The quantity display field 170 can display a $ symbol when displaying power consumption in a dollar amount. The quantity display field 170 may also display icons that indicate whether the quantity being displayed is for current energy consumption, total energy consumption or future predicted energy consumption. The unit display field 172 displays an appropriate unit for the quantity being displayed in the quantity display field 170. The unit display field 172 can display the following units: ° C., ° F., lbs $CO_2$, kWh, etc. The power meter display field 174 displays a digital representation of the power meter disk 18 including the black mark 20. The digital representation of the power meter disk 18 rotates at the same speed that the actual power meter disk 18 rotates. This field can also provide a relative indication of the amount of energy consumption, such as a big dollar sign or a little dollar sign, to signify whether there is currently a large or small amount of energy that is being consumed. The date display field 176 displays the current date and the time display field 178 displays the current time. The low battery indicator field 180 can provide a display of a battery that is almost empty to indicate that the detection unit 12 is running out of power.

The keypad 164 includes an up-scroll key 182, a down-scroll key 184 and a select key 186. The up-scroll and down-scroll keys 182 and 184 allow the user to scroll through different options such as scrolling through the type of numerical data that is to be displayed on the display 162, or scrolling through the different locations so that the consumer may select the location in which the power meter reader system is being used, etc. The select key 184 is used to select one of the options.

The communication port 166 is used to connect the display unit 160 to a computer or another suitable computing device, as described in the description of the power meter reader system 10'. The power connection port 168 is used to connect the display unit 160 to a power source. Most likely, an adaptor may be used to connect the display unit 160 to an electrical outlet.

Figure 6A:
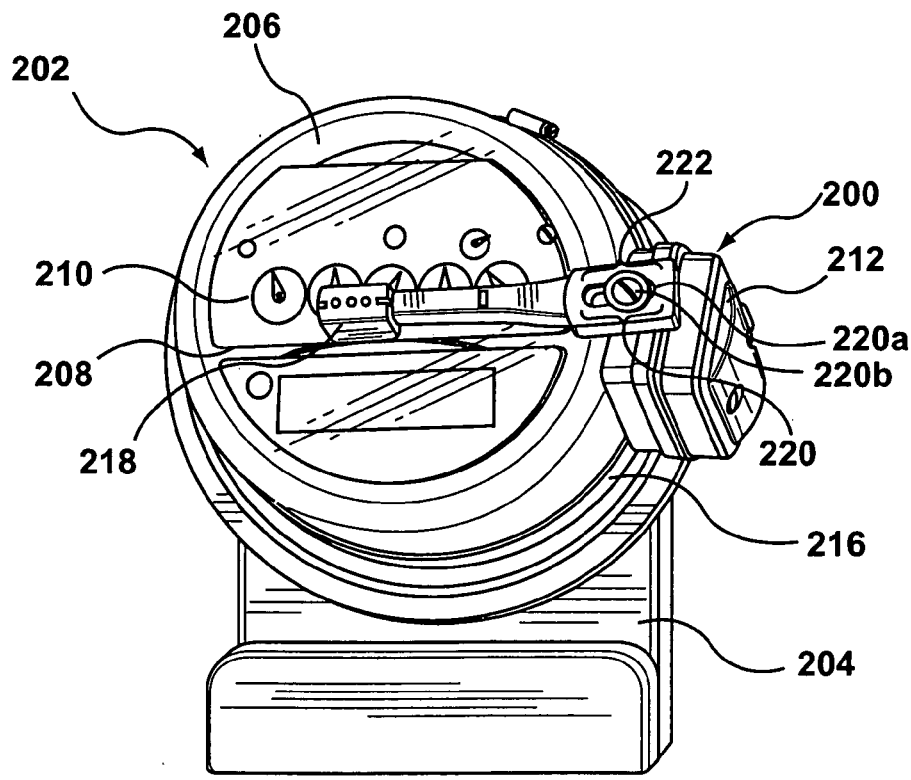
FIG. 6a is a front view of an exemplary physical embodiment of a detection unit attached to a power meter that can be used with the power meter reader systems of FIGS. 1 and 2.
Figure 6B:
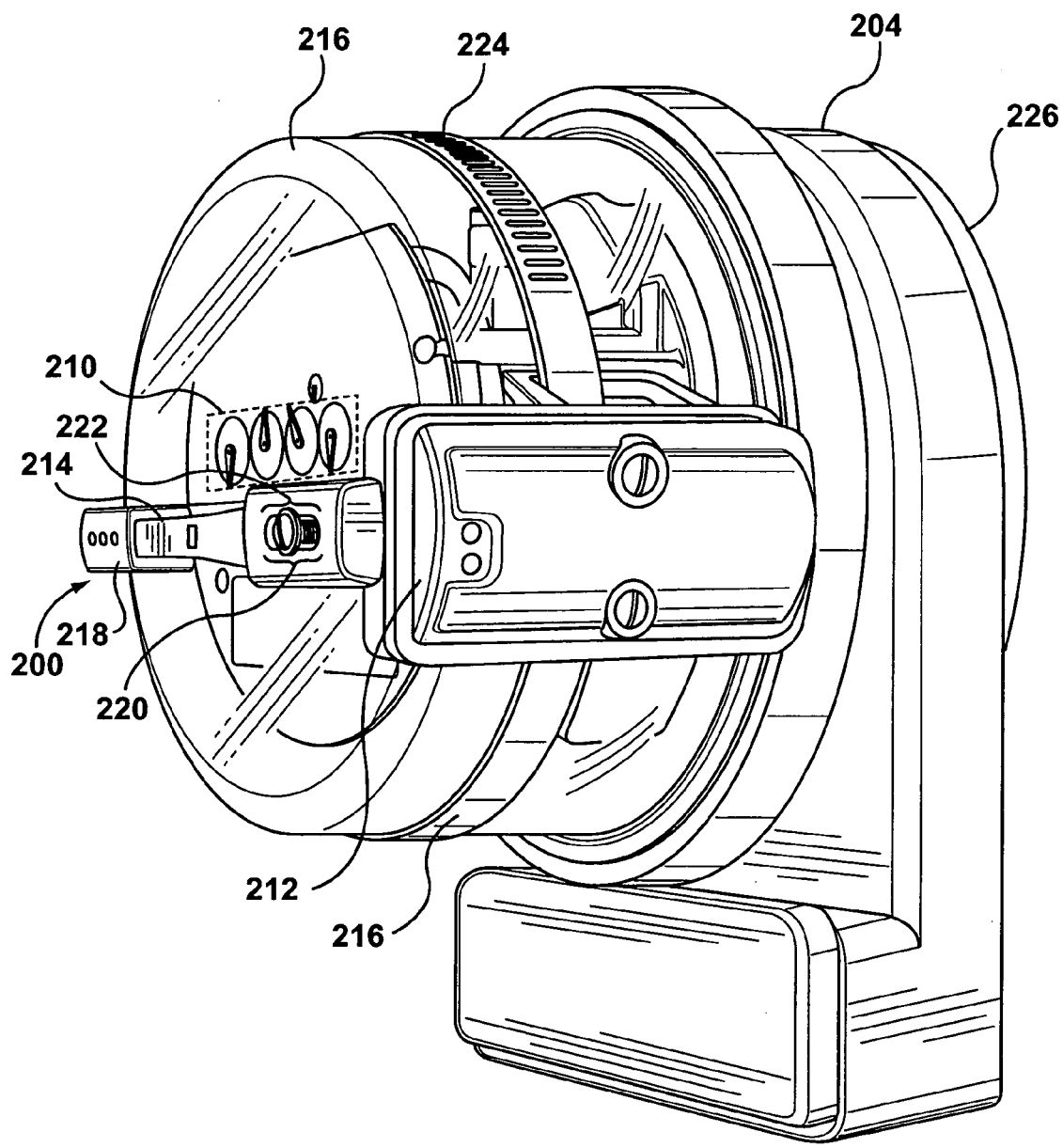

Referring now to FIGS. 6a, and 6b, shown therein are views of an exemplary physical embodiment of a detection unit 200 of the power meter reader system attached to a power meter 202. The power meter 202 is a conventional meter with a durable outer casing 204, a cover 206, a power meter disk 208 and a plurality of dials 210. The cover 206 is made of glass or plastic, has circular sidewalls with a flat front face and is transparent to allow an individual to read the dials 210 which indicate power consumption. The power meter disk 208 is usually made from aluminum or another suitable metal, and is flat with a black mark at a predetermined location along its outer edge. The power meter disk 208 rotates about a vertical axis at a rate that is dependent upon the current drawn by the structure which is being monitored by the power meter 202; the more current that is used, the faster the power meter disk 208 rotates. The power meter 202 is sealed to provide protection from the elements and to prevent tampering with the power meter disk 208 and the dials 210. The power meter 202 is of conventional construction the inner workings are known by those skilled in the art. It should be noted that power meter 202 is shown for exemplary purposes and that the display unit 200 can be mounted to other different power meter designs.

The detection unit 200 has been specially designed to fit and work with different shapes and sizes of power meters. The detection unit 200 has also been specially designed so that it does not block the power meter disk 208, the dials 210 or the serial number when it is attached to the power meter 202 so that a person from the utility company can read the power meter 202 if needed. The detection unit 200 includes a main body 212, an extension member 214 and an attachment means 216 for attaching the detection unit 200 to the power meter 202. The main body 212 houses most of the electronics of the detection unit 200.

The extension member 214 houses the sensor unit 22 in a head region 218. The extension member 214 also includes a longitudinal extension means 220 and a pivot means 222 for positioning the sensor unit 22 over the power meter disk 208. In this embodiment, the longitudinal extension means 220 comprises a slot 220a and a fastener 220b (in this case a screw for example, although other suitable fasteners may be used). The extension member 214 is extended over the face of the power meter 200, via the longitudinal extension means 220, until the head region 218 of the power meter 200 is directly over an appropriate region of the power meter disk 208. In particular, the head region 218 is preferably located so that the sensor unit 22 lies directly over the center of the power meter disk 208 because this is the location at which the black mark on the power meter disk 208 comes closest to the front face of the power meter 202. Accordingly, this is the point at which the SNR of reflected signals will be highest for the sensor unit 22. The fastener 220b is then placed through the slot 220a to engage a borehole 220c (see FIG. 6c) in the main body 212 to maintain the extension member 214 with a certain amount of extension and at a certain angle with respect to the main body 212. In this embodiment, the fastener 220b and the borehole 220c also provide the pivot means 222. The extension member 214 can be placed at an angle other than 90 degrees (as is currently depicted in FIGS. 6a and 6b) with respect to the main body 212. It should be understood by those skilled in the art that other implementations are possible for the longitudinal extension means 220 and the pivot means 222. For instance, the extension member 214 can include a telescopic section for implementing the longitudinal extension means 220.

The attachment means 216 is used to attach the detection unit 200 to the power meter 202. In this embodiment, the attachment means 216 includes a hose clamp 224 that slidably, releasably engages a loop member 226 on the main body 212 and extends around the perimeter of the power meter 202 to secure the detection unit 200 to the power meter 202. The hose clamp 224 is preferably made from a durable material that is either flexible (or thin enough to be flexible) such as steel. The hose clamp 224 has a series of serrations so that the clamping portion (not shown) can attach at a number of positions to accommodate power meters 202 with a variety of different diameters. However, in general, any appropriate clamping means can be used for the attachment means such as clamps that include a lever, a latch (such as an over-center latch), or a ratchet means for providing a tight fit for the attachment means.

Figure 6C:
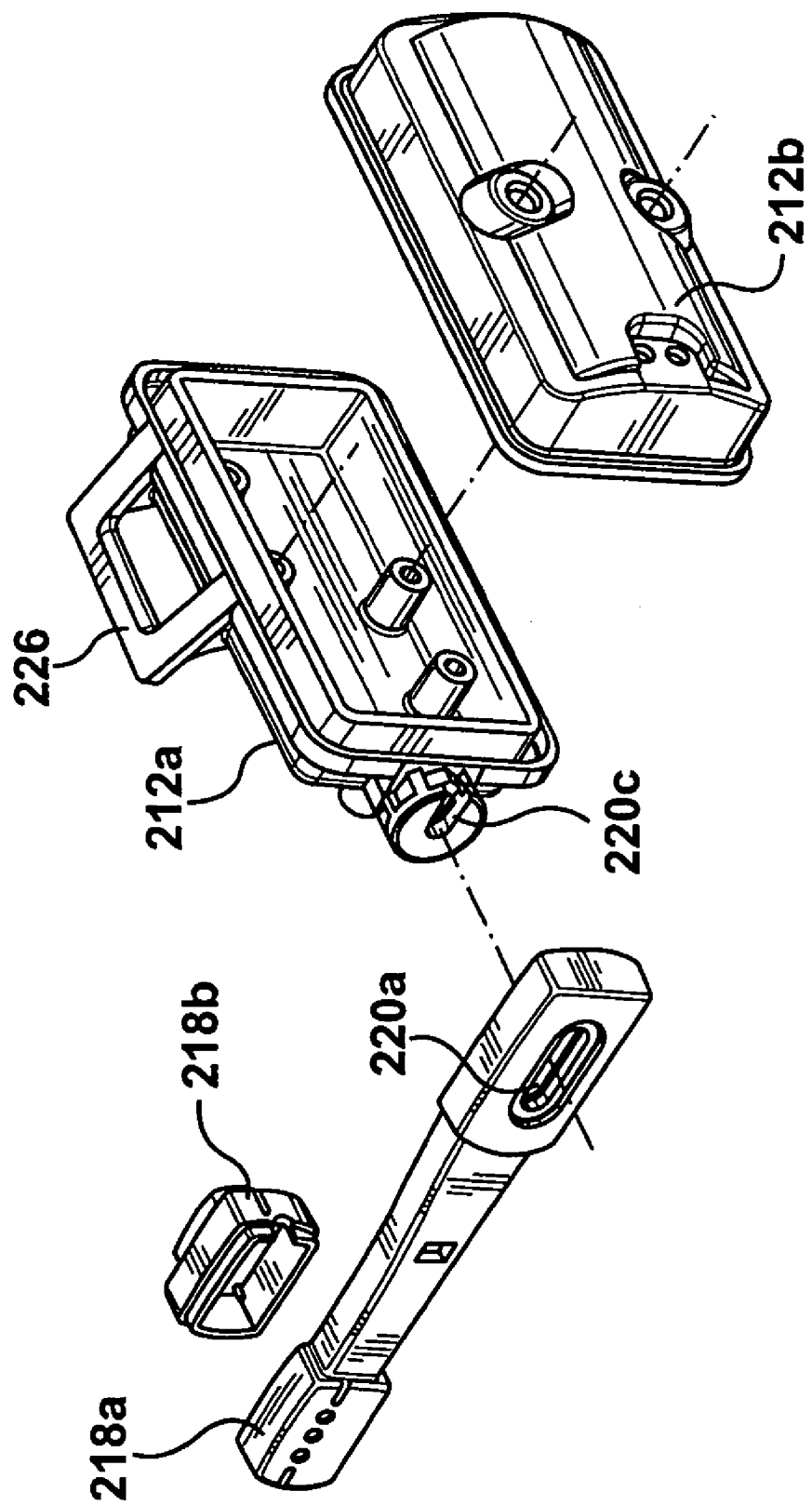

Referring now to FIG. 6c, shown therein is an exploded isometric view of the main body 212 and the extension member 214 of the detection unit 200 of FIG. 6a. The main body 212 includes a first piece 212a and a second piece 212b which are molded to provide a friction fit with one another. The head region 218 includes a first piece 218a and a second piece 218b that are also molded to provide a friction fit with one another.

It should be understood by those skilled in the art that while the power meter unit 16 described herein is as an electromechanical meter, the power meter reader system of the invention may also work with a digital power meter unit. Digital power meter units provide an output that emulates the rotation of the power meter disk. The output is usually on an LED screen and could be a mark that rotates, or flashes or travels horizontally at the same rate as the black mark on the power meter disk 18 would rotate. In each of these cases, the sensor unit 22 of the invention can be used to sense the movement of the mark. Accordingly, in general, the power meter reader of the invention, and more particularly the sensor unit 22, monitors a cyclical property of an indication on a power meter reader that has a varying period that indicates power consumption. The cyclical property could be the rotation of the black mark on the power meter disk, the flashing of a mark on an LED screen, the rotation of a mark on an LED screen or any other repetitive movement of the mark on the LED screen. In these cases, the sensor unit 22 still operates in a sleep mode when before and after the mark indicates the completion of one cycle that is similar to one cycle or rotation of the power meter disk 18.

In addition, in another alternative, the digital power meter may emit infrared energy that indicates the power consumption of the structure. In this case, infrared energy is not emitted by the sensor unit 22. Rather, the receiver of the sensor unit 22 operates as previously described, i.e. using sleep mode and tracking to reduce power consumption, while detecting rotations of the simulated power meter disk. The remainder of the power meter system works as previously described. Further, the transmission protocol that is used to reduce power consumption does not depend on whether the power meter unit is electromechanical or digital.

The elements of the power meter reader system 10 shown in FIGS. 1, and 2 may be implemented by any means known in the art although the use of dedicated hardware such as a controller with associated memory may be preferable. Furthermore, certain components of the motion compensation unit 10 may be implemented by the same structure. For instance, the tracking unit 44, the prediction unit 46 and the compression unit 48 may be implemented by the same hardware structure. Furthermore, some of the components can be implemented in software as is known to those skilled art which may be written in C, C++, or any other suitable programming language embodied in a computer readable medium on a computing platform having an operating system and the associated hardware and software. The computer program may comprise computer instructions that are adapted to perform the functionality of some of the components of the processing unit for example. The computer programs may comprise modules or classes, as is known in object oriented programming, that are implemented and structured according to the structure shown in FIGS. 1 and 2; separate software modules may be designed for the components. Alternatively, the functionality of these components may be combined into a smaller number of software modules where appropriate.

It should be understood that various modifications can be made to the embodiments described and illustrated herein, without departing from the invention, the scope of which is defined in the appended claims. For instance, the display unit need not be installed in the structure that is consuming power since there are some applications in which one display unit can be linked to several detection units so that power consumption of several structures can be monitored from a central location. In this case, the display unit needs to be augmented to recognize the identity of several detection units and keep separate records for each detection unit.

The invention claimed is:

1. A power meter reader system for automatically reading a power meter unit mounted on a structure that is consuming power, the power meter unit including an indication with a cyclical property having a period that varies at a rate indicative of power consumption of the structure, the system comprising:

a) a detection unit mounted on the power meter unit for monitoring the power consumption, the detection unit comprising:
  i) a sensor unit disposed adjacent to the power meter for monitoring the cyclical property of the indication and generating a consumption detection signal;
  ii) a processing unit connected to the sensor unit for receiving the consumption detection signal and generating an information signal, the processing unit including a tracking unit for tracking the cyclical property of the indication and for generating a sleep period, the processing unit generates a sensor enable signal to enable the sensor unit for only a portion of the cyclical property of the indication, the portion coinciding with a time interval indicating the completion of one period of the cyclical property, the time interval being shorter than the period of the cyclical property, otherwise the sensor unit being disabled during the sleep period; and,
  iii) a transmitter connected to the processing unit for receiving the information signal and transmitting a transmission signal; and,
b) a display unit located remotely with respect to the detection unit, the display unit receiving the transmission signal and displaying the power consumption.

2. The system of claim 1, wherein the processing unit includes a control unit for directing the activity of the processing unit.

3. The system of claim 1, wherein the sleep period is a percentage of the last value of the cyclical property of the indication.

4. The system of claim 1, wherein the sleep period is adjusted based on a history of values for the cyclical property of the indication.

5. The system of claim 1, wherein the processing unit further comprises a prediction unit for generating values for prediction model parameters to predict power consumption data derived from the consumption detection signal, and wherein the values of the prediction model parameters are incorporated into the information signal rather raw data in the consumption detection signal.

6. The system of claim 5, wherein the prediction unit updates the values of the prediction model parameters when data generated by the prediction model parameters differs from the power consumption data derived from the consumption detection signal by a value greater than a prediction error value.

7. The system of claim 6, wherein the transmitter transmits the transmission signal to the display unit every time new values for the prediction model parameters are calculated.

8. The system of claim 1, wherein the processing unit further comprises a compression unit for compressing data in the information signal.

9. The system of claim 1, wherein the detection unit further comprises a temperature unit for monitoring outdoor temperature and providing a temperature signal to the processing unit, and wherein data from the temperature signal is incorporated into the information signal.

10. The system of claim 1, wherein the display unit comprises:
c) a display processing unit for controlling the operation of the display unit;
d) a receiver connected to the display processing unit for receiving and processing the transmission signal to provide a received signal to the display processing unit;
e) a display connected to the display processing unit for displaying information related to power consumption of the structure; and,
f) an interface unit connected to the display processing unit for allowing a user to input information and select modes of operation for the display unit.

11. The system of claim 10, wherein the display unit further comprises
g) a real-time clock connected to the display processing unit for providing time information;
h) a buzzer unit connected to the display processing unit for providing audible information to the user; and,
i) a memory unit connected to the display processing unit for storing information related to power consumption of the structure.

12. The system of claim 10, wherein the display unit further comprises a communication unit connected to the display processing unit for providing a connection to an external computing device for uploading the power consumption information and downloading power consumption rates.

13. The system of claim 1, wherein the display unit comprises:
c) a display processing unit for controlling the operation of the display unit;
d) a receiver connected to the display processing unit for receiving and processing the transmission signal to provide a received signal to the display processing unit, and,
e) an appliance control unit connected to the display processing unit for controlling at least one appliance in the structure, the appliance control unit receiving at least one of temperature information, power consumption information and time information and generating an appliance control signal for controlling an operational setting of the at least one appliance.

14. The system of claim 1, wherein the detection unit comprises:
c) a main body for housing the processing unit and the transmitter;
d) an extension member connected to the main body, the extension member having a head region for housing the sensor unit; and,
e) an attachment means connected to the main body for mounting the main body on the power meter.

15. The system of claim 14, wherein the extension member includes an extension means for extending the location of the head portion for positioning the sensor unit adjacent to a location where the indication appears.

16. The system of claim 14, wherein the extension member further includes a pivot means for positioning the extension member at a desired angle with respect to the main body.

17. The system of claim 14, wherein the attachment means includes a clamping means that slidably engages a loop member on the main body, the clamping means extending around the perimeter of the power meter unit.

18. The system of claim 1, wherein the sensor unit comprises an emitter, a first detector and a second detector, each directed towards a location where the indication appears, the emitter being disposed between the first and second detectors, the emitter being adapted to emit IR energy at the location where the indication appears, and the first and second detectors are adapted to detect a level of IR energy related to the indication, the first and second detectors providing first and second detection signals indicative of the period of the cyclical property of the indication.

19. The system of claim 18, wherein the first and second detection signals are combined using the logical AND operator to provide the consumption detection signal.

20. The system of claim 18, wherein the first and second detection signals are combined by subtracting the first and second detection signals from one another.

21. A power meter reader system for automatically reading a power meter unit mounted on a structure that is consuming power, the power meter unit including an indication with a cyclical property having a period that varies at a rate indicative of power consumption of the structure, the system comprising:
a) a detection unit mounted on the power meter unit for monitoring the power consumption, the detection unit comprising:
i) a sensor unit disposed adjacent to the power meter unit for monitoring the cyclical property of the indication and generating a consumption detection signal;
ii) a processing unit connected to the sensor unit for receiving the consumption detection signal and generating an information signal, the processing unit including a prediction unit for generating values for prediction model parameters for predicting data in the consumption detection signal and incorporating the values of the prediction model parameters into the information signal; and, iii) a transmitter connected to the processing unit for receiving the information signal and transmitting a transmission signal;

b) a display unit located remotely with respect to the detection unit, the display unit receiving the transmission signal and displaying the power consumption of the structure based on the prediction model parameters.

22. The system of claim 21, wherein the prediction unit updates the values of the prediction model parameters when data generated by the prediction model parameters differs from data in the consumption detection signal by a value greater than a prediction error value.

23. The system of claim 22, wherein the transmitter transmits the transmission signal to the display unit every time new values for the prediction model parameters are calculated.

24. The system of claim 21, wherein the processing unit includes a control unit for directing the activity of the processing unit and a tracking unit connected to the control unit for tracking the cyclical property of the indication and for generating a sleep period during which the sensor unit is disabled, wherein the processing unit provides an enabling value in a sensor enable signal to enable the sensor unit for only a portion of the cyclical property of the indication, the portion coinciding with a time interval indicating the completion of one period of the cyclical property, the time interval being shorter than the period of the cyclical property, otherwise the sensor enable signal being adapted to disable the sensor unit based on the sleep period.

25. The system of claim 24, wherein the sleep period is a percentage of the last value of the cyclical property of the indication.

26. The system of claim 24, wherein the sleep period is adjusted based on a history of values for the cyclical property of the indication.

27. The system of claim 21, wherein the processing unit further comprises a compression unit for compressing data in the information signal.

28. The system of claim 21, wherein the detection unit further comprises a temperature unit for monitoring outdoor temperature and providing a temperature signal to the processing unit, and wherein data from the temperature signal is incorporated into the information signal.

29. The system of claim 21, wherein the display unit comprises:

c) a display processing unit for controlling the operation of the display unit;

d) a receiver connected to the display processing unit for receiving and processing the transmission signal to provide a received signal to the display processing unit;

e) a display connected to the display processing unit for displaying information related to power consumption of the structure; and, f) an interface unit connected to the display processing unit for allowing a user to input information and select modes of operation for the display unit.

30. The system of claim 29, wherein the display unit further comprises g) a real-time clock connected to the display processing unit for providing time information;

h) a buzzer unit connected to the display processing unit for providing audible information to the user; and, i) a memory unit connected to the display processing unit for storing information related to the power consumption of the structure.

31. The system of claim 29, wherein the display unit further comprises a communication unit connected to the display processing unit for providing a connection to an external computing device for uploading the power consumption information and downloading power consumption rates.

32. The system of claim 21, wherein the display unit comprises:

c) a display processing unit for controlling the operation of the display unit;

d) a receiver connected to the display processing unit for receiving and processing the transmission signal to provide a received signal to the display processing unit, and, e) an appliance control unit connected to the display processing unit for controlling at least one appliance in the structure, the appliance control unit receiving at least one of temperature information, power consumption information and time information and generating an appliance control signal for controlling an operational setting of the at least one appliance.

33. The system of claim 21, wherein the sensor unit comprises an emitter, a first detector and a second detector, each directed towards a location where the indication appears, the emitter being disposed between the first and second detectors, the emitter being adapted to emit IR energy at a location where the indication appears, and the first and second detectors are adapted to detect a level of IR energy related to the indication, the first and second detectors providing first and second detection signals indicative of the completion of one period of the cyclical property of the indication.

34. The system of claim 33, wherein the first and second detection signals are combined using the logical AND operator to provide the consumption detection signal.

35. The system of claim 33, wherein the first and second detection signals are combined by subtracting the first and second detection signals from one another.

36. A detection unit for use with a power meter unit mounted on a structure that is consuming power, the power meter unit including an indication with a cyclical property having a period that varies at a rate indicative of power consumption of the structure, the detection unit mounted on the power meter unit for monitoring the power consumption, the detection unit comprising:

a) a sensor unit disposed adjacent to the power meter unit for monitoring the cyclical property of the indication and generating a consumption detection signal; and, b) a processing unit connected to the sensor unit for receiving the consumption detection signal and generating an information signal, the processing unit including a tracking unit for tracking the cyclical property of the indication and for generating a sleep period, the processing unit generates a sensor enable signal to enable the sensor unit for only a portion of the cyclical property of the indication, the portion coinciding with a time interval indicating the completion of one period of the cyclical property, the time interval being shorter than the period of the cyclical property, otherwise the sensor unit being disabled during the sleep period.

37. The detection unit of claim 36, wherein the detection unit further comprises:

c) a control unit for directing the activity of the processing unit; and, d) a transmitter connected to the processing unit for receiving the information signal and transmitting a transmission signal.

38. The detection unit of claim 36, wherein the sleep period is a percentage of the last value of the cyclical property of the indication.

39. The detection unit of claim 36, wherein the sleep period is adjusted based on a history of values for the cyclical property of the indication.

40. The detection unit of claim 36, wherein the processing unit further comprises a prediction unit for generating values for prediction model parameters to predict power consumption data derived from the consumption detection signal, and wherein the values for the prediction model parameters are used in the information signal rather than raw data in the consumption detection signal.

41. The detection unit of claim 36, wherein the prediction unit updates the values for the prediction model parameters when data generated by the prediction model parameters differs from the power consumption data derived from the consumption detection signal by a value greater than a prediction error value.

42. The detection unit of claim 36, wherein the processing unit further comprises a compression unit for compressing data in the information signal.

43. The detection unit of claim 36, wherein the detection unit further comprises a temperature unit for monitoring outdoor temperature and providing a temperature signal to the processing unit, and wherein the temperature signal is incorporated into the information signal.

44. The detection unit of claim 36, wherein the sensor unit comprises an emitter, a first detector and a second detector, each directed towards a location where the indication appears, the emitter being disposed between the first and second detectors, the emitter being adapted to emit IR energy at the location where the indication appears, and the first and second detectors are adapted to detect a level of IR energy related to the indication, the first and second detectors providing first and second detection signals indicative of the period of the cyclical property of the indication.

45. The detection unit of claim 44, wherein the first and second detection signals are combined using the logical AND operator to provide the consumption detection signal.

46. The detection unit of claim 44, wherein the first and second detection signals are combined by subtracting the first and second detection signals from one another.

47. A detection unit for use with a power meter unit mounted on a structure that is consuming power, the power meter unit including an indication with a cyclical property having a period that varies at a rate indicative of power consumption of the structure, the detection unit mounted on the power meter unit for monitoring the power consumption, the detection unit comprising:
  a) a sensor unit disposed adjacent to the power meter unit for monitoring the cyclical property of the indication and generating a consumption detection signal; and,
  b) a processing unit connected to the sensor unit for receiving the consumption detection signal and generating an information signal, the processing unit including a prediction unit for generating values for prediction model parameters for predicting power consumption data derived from the consumption detection signal and incorporating the values of the prediction model parameters into the information signal.

48. The detection unit of claim 47, wherein the prediction unit updates the values of the prediction model parameters when data generated by the prediction model parameters differs from the power consumption data derived from the consumption detection signal by a value greater than a prediction error value.

49. The detection unit of claim 47, wherein the detection unit further comprises:
  c) a control unit for directing the activity of the processing unit;
  d) a tracking unit connected to the control unit for tracking the cyclical property of the indication and for generating a sleep period during which the sensor unit is disabled, wherein the processing unit provides an enabling value in a sensor enable signal to enable the sensor unit for only a portion of the cyclical property of the indication, the portion coinciding with a time interval indicating the completion of one period of the cyclical property, the time interval being shorter than the period of the cyclical property, otherwise the sensor enable signal being adapted to disable the sensor unit based on the sleep period; and,
  e) a transmitter connected to the processing unit for receiving the information signal and transmitting a transmission signal.

50. The detection unit of claim 49, wherein the sleep period is a percentage of the last value of the cyclical property of the indication.

51. The detection unit of claim 49, wherein the sleep period is adjusted based on a history of values for the cyclical property of the indication.

52. The detection unit of claim 47, wherein the transmitter transmits the transmission signal to the display unit every time new values for the prediction model parameters are calculated.

53. The detection unit of claim 47, wherein the processing unit further comprises a compression unit for compressing data in the information signal.

54. The detection unit of claim 47, wherein the detection unit further comprises a temperature unit for monitoring outdoor temperature and providing a temperature signal to the processing unit, and wherein the temperature signal is incorporated into the information signal.

55. The detection unit of claim 47, wherein the sensor unit comprises an emitter, a first detector and a second detector, each directed towards a location where the indication appears, the emitter being disposed between the first and second detectors, the emitter being adapted to emit IR energy at a location where the indication appears, and the first and second detectors are adapted to detect a level of IR energy related to the indication, the first and second detectors providing first and second detection signals indicative of the period of the cyclical property of the indication.

56. The detection unit of claim 55, wherein the first and second detection signals are combined using the logical AND operator to provide the consumption detection signal.

57. The detection unit of claim 55, wherein the first and second detection signals are combined by subtracting the first and second detection signals from one another.

58. A method for automatically reading a power meter unit mounted on a structure that is consuming power, the power meter unit including an indication with a cyclical property having a period that varies at a rate indicative of power consumption of the structure, the method comprising:
  a) sensing a variation of the cyclical property of the indication using a sensor unit and generating a consumption detection signal;
  b) tracking the cyclical property of the indication for generating a sleep period;
  c) generating an information signal based on data from the consumption detection signal; and,
  d) generating a sensor enable signal to enable the sensor unit for only a portion of the cyclical property of the indication, the portion coinciding with a time interval indicating the completion of one period of the cyclical property, the time interval being shorter than the period of the cyclical property, otherwise disabling the sensor unit during the sleep period.

59. The method of claim 58, wherein the method further comprises:
   e) transmitting a transmission signal based on the information signal; and at a remote location relative to the power meter unit,
   f) receiving and processing the transmission signal for obtaining power consumption information; and,
   g) displaying the power consumption information.

60. The method of claim 58, wherein the method further comprises generating the sleep period as a percentage of the last value of the cyclical property of the indication.

61. The method of claim 58, wherein the method further comprises generating the sleep period based on a history of values for the cyclical property of the indication.

62. The method of claim 58, wherein step c) includes generating values for prediction model parameters to predict power consumption data derived from the consumption detection signal.

63. The method of claim 62, wherein the method further includes updating the values for the prediction model parameters when data generated by the prediction model parameters differs from the power consumption data derived from the consumption detection signal by a value greater than a prediction error value.

64. The method of claim 59, wherein step e) includes compressing data in the information signal to produce the transmission signal.

65. The method of claim 58, wherein step c) includes monitoring outdoor temperature and incorporating temperature data into the information signal.

66. The method of claim 59, wherein the method further includes:
   h) storing information related to the power consumption of the structure; and,
   i) predicting future power consumption of the structure based on the stored information.

67. The method of claim 59, wherein the method further includes providing a connection to an external computing device for uploading the power consumption information and downloading power consumption rates.

68. The method of claim 58, wherein the method further comprises generating an appliance control signal for controlling an operational setting of at least one appliance in the structure, the appliance control signal being generated based on at least one of temperature information, power consumption information and time information.

69. A method for automatically reading a power meter unit mounted on a structure that is consuming power, the power meter unit including an indication with a cyclical property having a period that varies at a rate indicative of power consumption of the structure, the method comprising:
   a) sensing a variation of the cyclical property of the indication using a sensor unit and generating a consumption detection signal; and,
   b) generating an information signal based on data from the consumption detection signal by generating values for prediction model parameters to predict power consumption data derived from the consumption detection signal and including the values of the prediction model parameters in the information signal.

70. The method of claim 69, wherein the method further comprises:
   c) transmitting a transmission signal based on the information signal; and at a remote location relative to the power meter unit,
   d) receiving and processing the transmission signal for obtaining power consumption information; and,
   e) displaying the power consumption information.

71. The method of claim 69, wherein step (b) includes updating the values for the prediction model parameters when data generated by the prediction model parameters differs from the power consumption data derived from the consumption detection signal by a value greater than a prediction error value.

72. The method of claim 70, wherein step (c) includes transmitting the transmission signal every time new values for the prediction model parameters are calculated.

73. The method of claim 69, wherein step (a) includes:
   c) tracking the cyclical property of the indication for generating a sleep period during which a sensor enable signal disables the sensor unit; and,
   d) generating the sleep period during which the sensor unit is disabled by providing an enabling value in the sensor enable signal to enable the sensor unit for only a portion of the cyclical property of the indication, the portion coinciding with a time interval indicating the completion of one period of the cyclical property, the time interval being shorter than the period of the cyclical property, otherwise the sensor enable signal being adapted to disable the sensor unit based on the sleep period.

74. The method of claim 73, wherein the method further comprises generating the sleep period as a percentage of the last value of the cyclical property of the indication.

75. The method of claim 73, wherein the method further comprises generating the sleep period based on a history of values for the cyclical property of the indication.

76. The method of claim 70, wherein step (c) includes compressing data in the information signal to produce the transmission signal.

77. The method of claim 69, wherein step (b) includes monitoring outdoor temperature and incorporating temperature data into the information signal.

78. The method of claim 70, wherein the method further includes:
   f) storing information related to the power consumption of the structure; and,
   g) predicting future power consumption of the structure based on the stored information.

79. The method of claim 70, wherein the method further includes providing a connection to an external computing device for uploading the power consumption information and downloading power consumption rates.

80. The method of claim 69, wherein the method further comprises generating an appliance control signal for controlling an operational setting of at least one appliance in the structure, the appliance control signal being generated based on at least one of temperature information, power consumption information and time information.

81. The system of claim 1, wherein the sleep period is increased for shorter periods of the cyclical property of the indication and the sleep period is decreased for longer periods of the cyclical property of the indication.

82. The system of claim 1, wherein the sleep period is adjusted based on the time of day.

83. The system of claim 1, wherein the sleep period is adjusted between a lower limit and a higher limit.

84. The system of claim 6, wherein the prediction error value is chosen in accordance with a minimum and maximum time period for transmitting the transmission signal.

85. The detection unit of claim 36, wherein the sleep period is increased for shorter periods of the cyclical property of the indication and the steep period is decreased for longer periods of the cyclical property of the indication.

86. The detection unit of claim 36, wherein the sleep period is adjusted based on the time of day.

87. The detection unit of claim 36, wherein the sleep period is adjusted between a lower limit and a higher limit.

88. The detection unit of claim 41, wherein the prediction error value is chosen in accordance with a minimum and maximum time period for transmitting the transmission signal.

89. The method of claim 58, wherein step (b) of the method further comprises increasing the sleep period for shorter periods of the cyclical property of the indication and decreasing the sleep period for longer periods of the cyclical property of the indication.

90. The method of claim 58, wherein step (b) of the method further comprises adjusting the sleep period based on the time of day.

91. The method of claim 58, wherein step (b) of the method further comprises adjusting the sleep period between a lower limit and a higher limit.

92. The method of claim 63, wherein the method further comprises choosing the prediction error value in accordance with a minimum and maximum time period for transmitting the transmission signal.

* * * * *

UNITED STATES PATENT AND TRADEMARK OFFICE
CERTIFICATE OF CORRECTION

PATENT NO. : 7,174,260 B2
APPLICATION NO. : 10/814255
DATED : February 6, 2007
INVENTOR(S) : Maurice Tuff It is certified that error appears in the above-identified patent and that said Letters Patent is hereby corrected as shown below:

On the cover page and in item 75, the inventor should be listed as follows: Maurice Tuff, Witless Bay (CA)

In the Summary of the Invention, column 3, line 61, the word "indicaiton" has been changed to --indication--, so that the line reads "monitoring the cyclical property of the indication and gen-".

In the Brief Description of the Drawings, column 4, line 53, reference number "**3*f*f" has been changed to --3*f*--, so that the line reads "FIGS. **3*b*-3*f*** are a series of illustrations of the operation".

In the Brief Description of the Drawings, column 4, line 56, the word "is" has been deleted, so that the line reads "FIG. 4 shows a data structure that may be used for".

In the Detailed Description of the Invention, column 16, line 23, the punctuation "." Has been changed to a --,--, so that the line reads "PM, a utility company may charge 10 cents/KWh rather than".

In the Detailed Description of the Invention, column 26, line 10, the words --in the-- have been added after "skilled", so that lines 10 and 11 read "can be implemented in software as is known to those skilled in the art which may be written in C, C++, or any other suitable".

In the Claims, column 31, line 14, claim 41, the claim dependency "36" has been changed to --40--, so that the line reads "41. The detection unt of claim 40, wherein the prediction".

UNITED STATES PATENT AND TRADEMARK OFFICE
CERTIFICATE OF CORRECTION

PATENT NO. : 7,174,260 B2
APPLICATION NO. : 10/814255
DATED : February 6, 2007
INVENTOR(S) : Maurice Tuff It is certified that error appears in the above-identified patent and that said Letters Patent is hereby corrected as shown below:

In the Claims, column 32, line 26, claim 52, the claim dependency "47" has been changed to --49--, so that the line reads "52. The detection unit of claim 49, wherein the transmitter".

Signed and Sealed this

Fourth Day of March, 2008

JON W. DUDAS
*Director of the United States Patent and Trademark Office*